(12) United States Patent
Araki

(10) Patent No.: US 10,747,036 B2
(45) Date of Patent: Aug. 18, 2020

(54) DISPLAY DEVICE

(71) Applicant: Japan Display Inc., Minato-ku (JP)

(72) Inventor: Shigesumi Araki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 11 days.

(21) Appl. No.: 16/147,958

(22) Filed: Oct. 1, 2018

(65) Prior Publication Data

US 2019/0101785 A1    Apr. 4, 2019

(30) Foreign Application Priority Data

Oct. 2, 2017    (JP) .................................. 2017-192966

(51) Int. Cl.
| | |
|---|---|
| *G02F 1/1333* | (2006.01) |
| *H01L 51/00* | (2006.01) |
| *G02F 1/1337* | (2006.01) |
| *G02F 1/1335* | (2006.01) |
| *G02F 1/1362* | (2006.01) |
| *H01L 27/32* | (2006.01) |
| *H01L 51/50* | (2006.01) |
| *G02F 1/1343* | (2006.01) |

(Continued)

(52) U.S. Cl.
CPC .. *G02F 1/133305* (2013.01); *G02F 1/133512* (2013.01); *G02F 1/133528* (2013.01); *G02F 1/133707* (2013.01); *G02F 1/134309* (2013.01); *G02F 1/136286* (2013.01); *G06F 1/16* (2013.01); *H01L 27/3276* (2013.01); *H01L 51/0096* (2013.01); *H01L 51/5012* (2013.01); *H01L 51/5253* (2013.01); *G02F 2001/133357* (2013.01); *G02F 2201/121* (2013.01); *G02F 2201/123* (2013.01); *G02F 2201/50* (2013.01); *H01L 27/3258* (2013.01); *H01L 51/0097* (2013.01); *H01L 51/5281* (2013.01); *H01L 2251/5338* (2013.01)

(58) Field of Classification Search
None
See application file for complete search history.

(56) References Cited

U.S. PATENT DOCUMENTS

| 5,422,747 A | 6/1995 | Wakita | |
|---|---|---|---|
| 2004/0124763 A1* | 7/2004 | Nathan | ............... H01L 27/3244 313/498 |

(Continued)

FOREIGN PATENT DOCUMENTS

| JP | 06-289371 | 10/1994 |
|---|---|---|
| JP | 2017-003903 | 1/2017 |
| JP | 2018-084749 | 5/2018 |

*Primary Examiner* — Edward J Glick
*Assistant Examiner* — Mark D Teets
(74) *Attorney, Agent, or Firm* — Oblon, McClelland, Maier & Neustadt, L.L.P.

(57) ABSTRACT

According to one embodiment, a display device includes a flexible base, a display area, first lines arranged in a first direction, pixel electrodes, and a first inorganic insulating layer contacting the lines. The display area includes a first area in which the lines are arranged in the first direction at a first pitch and a second area in which the lines are arranged in the first direction at a second pitch greater than the first pitch, and the second area is located between the first area and an edge of the base in the first direction. In the second area, the first inorganic insulating layer comprises a first slit extending along the lines between adjacent lines.

15 Claims, 19 Drawing Sheets

(51) Int. Cl.
   *H01L 51/52*   (2006.01)
   *G06F 1/16*    (2006.01)

(56) References Cited

U.S. PATENT DOCUMENTS

| | | | | |
|---|---|---|---|---|
| 2010/0253902 | A1* | 10/2010 | Yamazaki | G02F 1/1303 |
| | | | | 349/158 |
| 2014/0231763 | A1* | 8/2014 | Kim | H01L 27/3218 |
| | | | | 257/40 |
| 2014/0361262 | A1* | 12/2014 | Kim | H01L 27/3218 |
| | | | | 257/40 |
| 2016/0118451 | A1* | 4/2016 | Youn | H01L 27/3262 |
| | | | | 257/40 |
| 2016/0363822 | A1 | 12/2016 | Asozu et al. | |
| 2017/0052404 | A1* | 2/2017 | Kang | G02F 1/133377 |
| 2017/0262022 | A1* | 9/2017 | Choi | G02B 5/3025 |
| 2017/0278900 | A1* | 9/2017 | Yang | H01L 27/3272 |
| 2018/0033843 | A1* | 2/2018 | Liu | G02F 1/133305 |
| 2018/0040680 | A1* | 2/2018 | Cai | G09G 3/20 |
| 2018/0149938 | A1 | 5/2018 | Asozu et al. | |

* cited by examiner

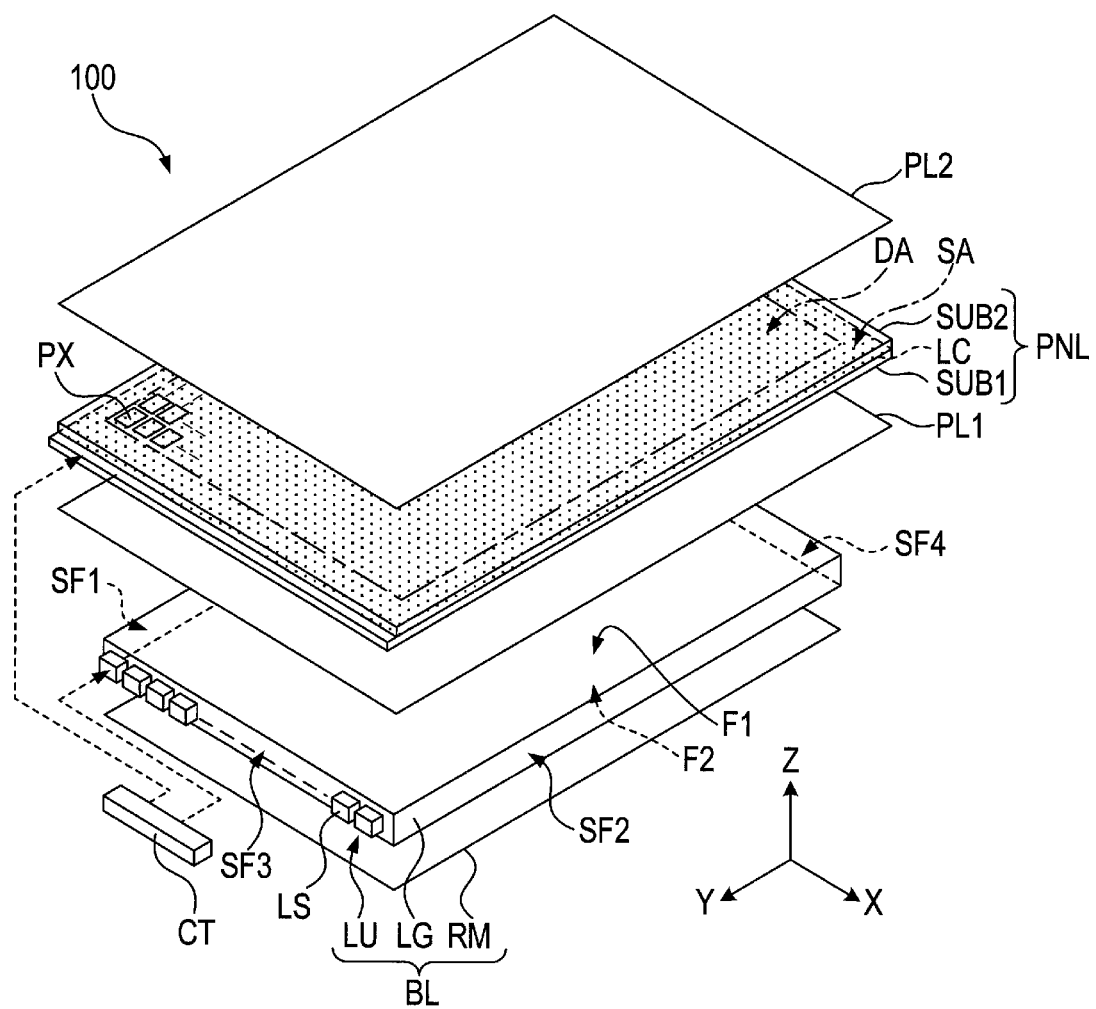
F I G. 1

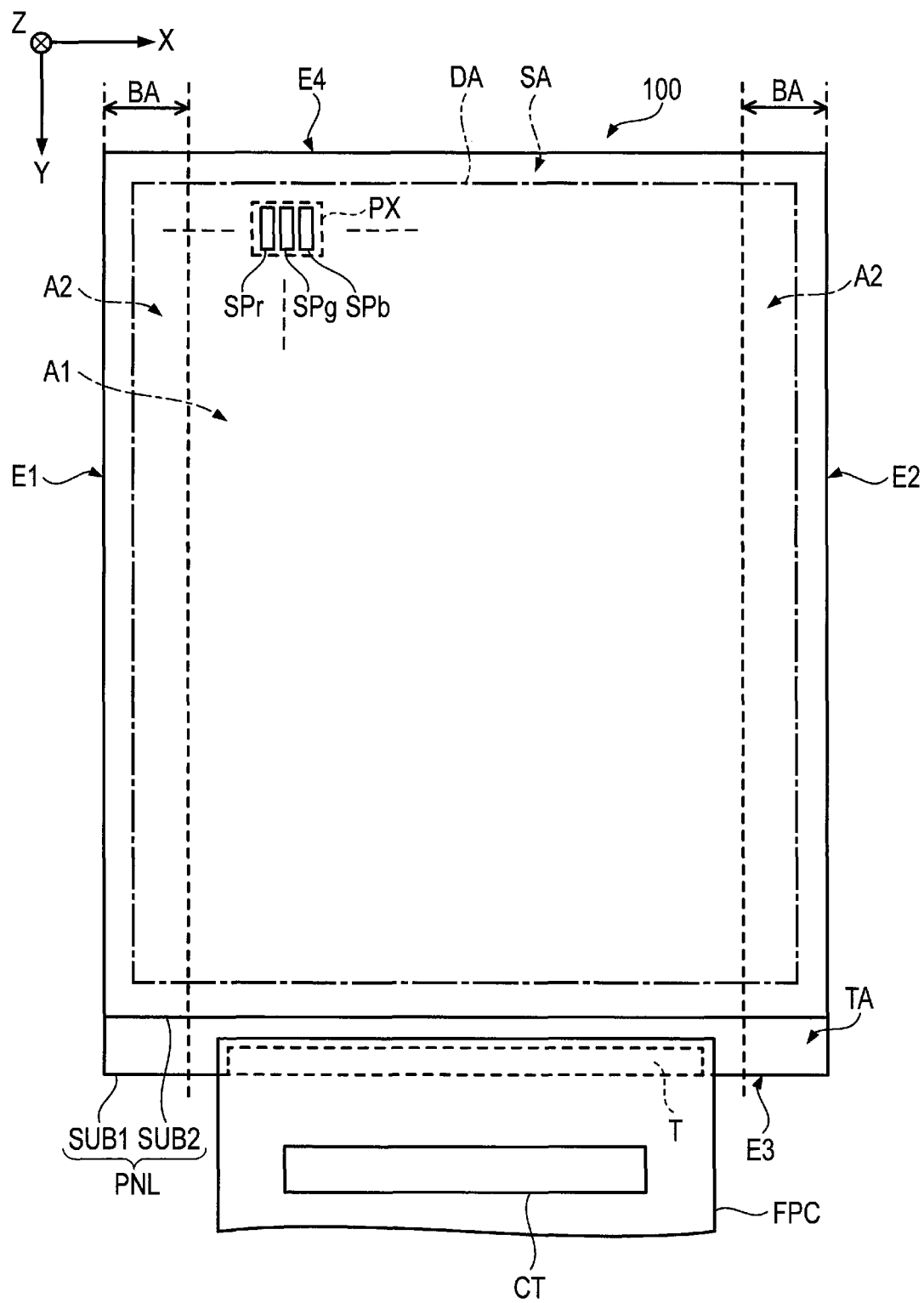
F I G. 2

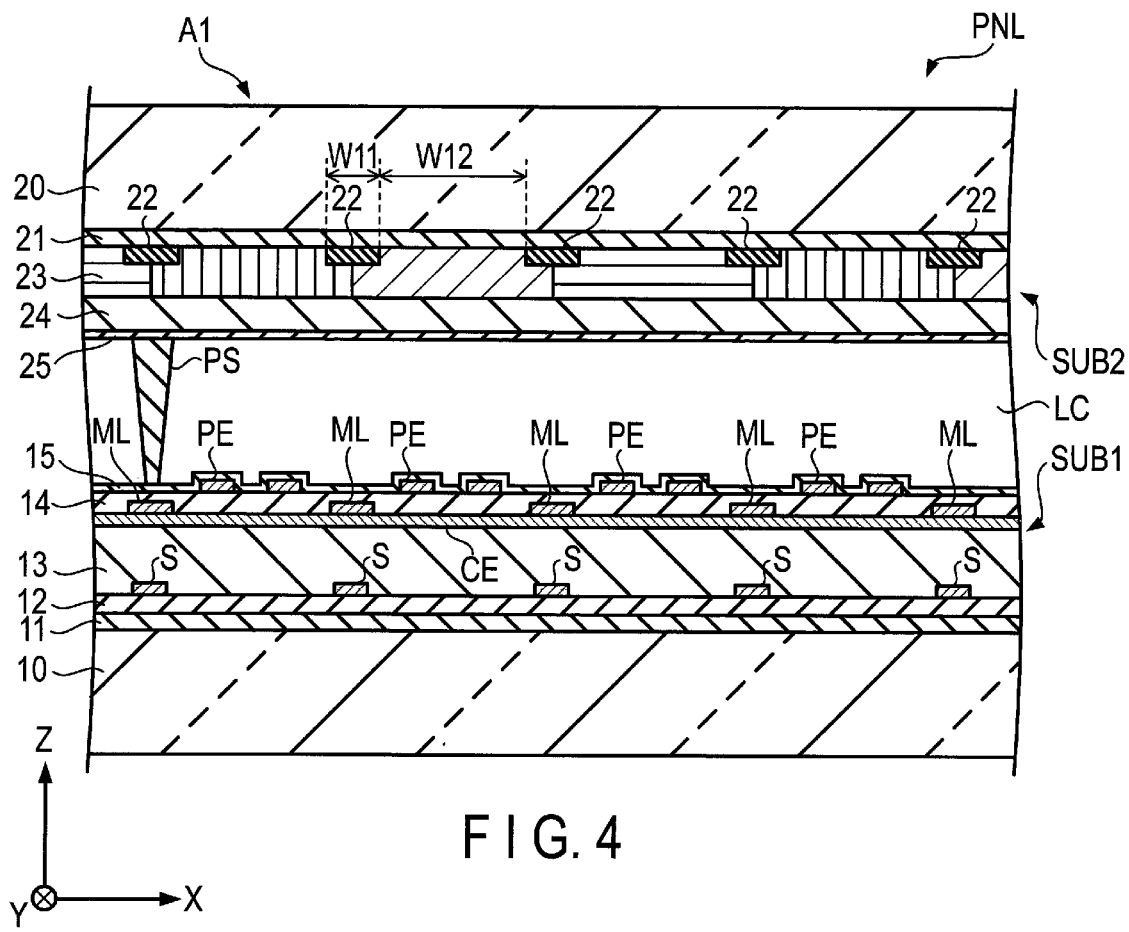
F I G. 4
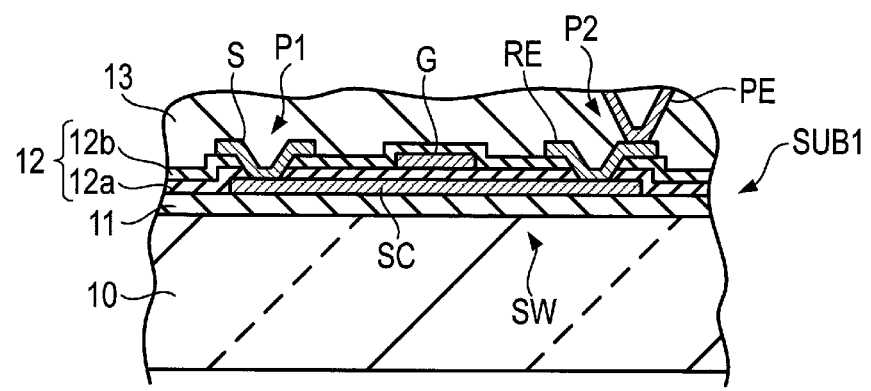
F I G. 5

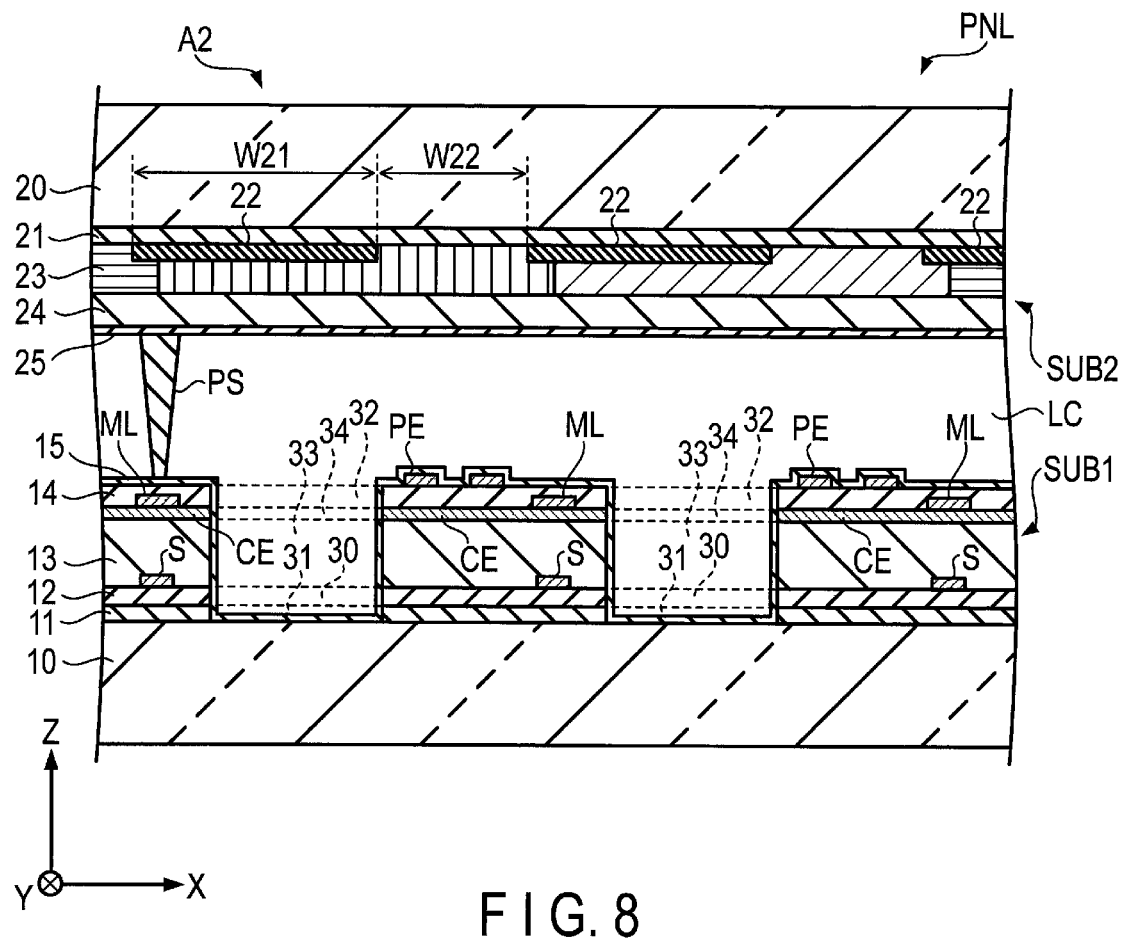
F I G. 8

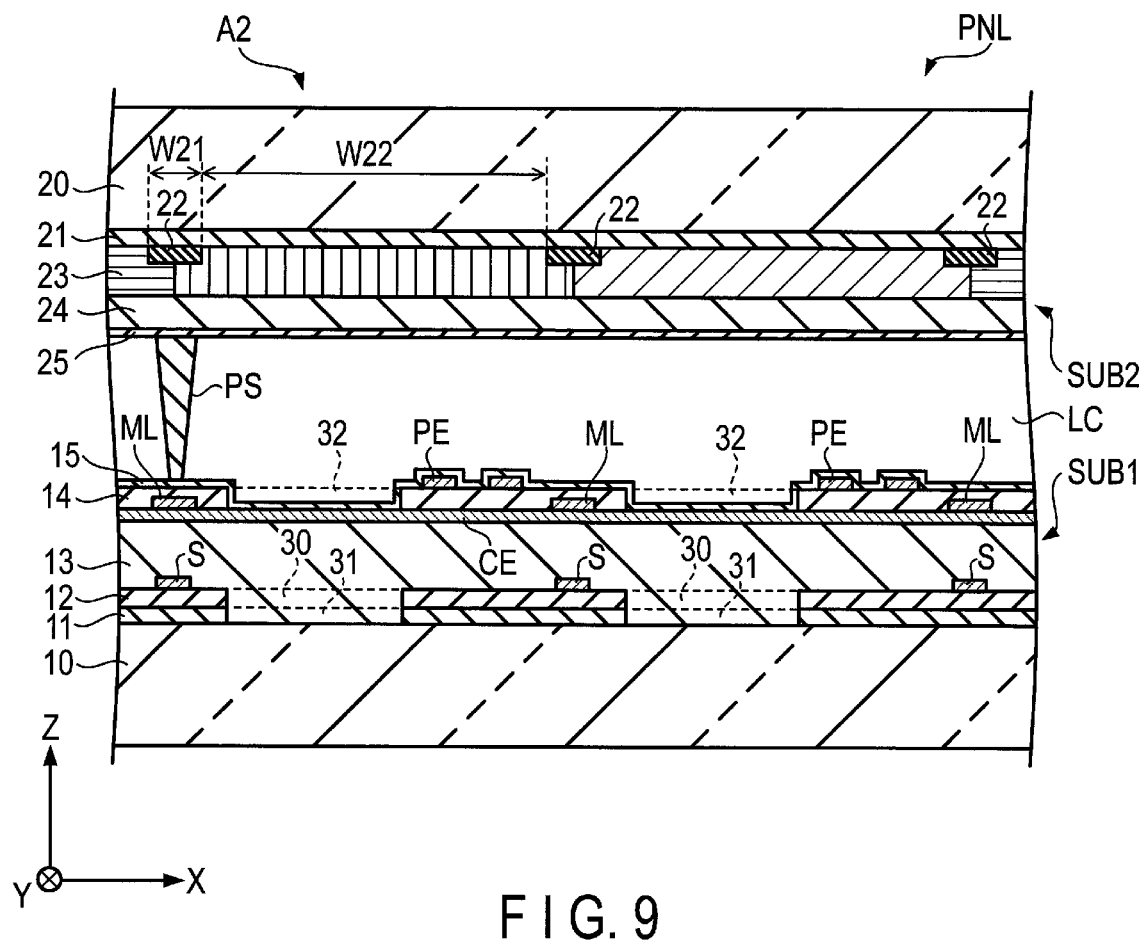
F I G. 9

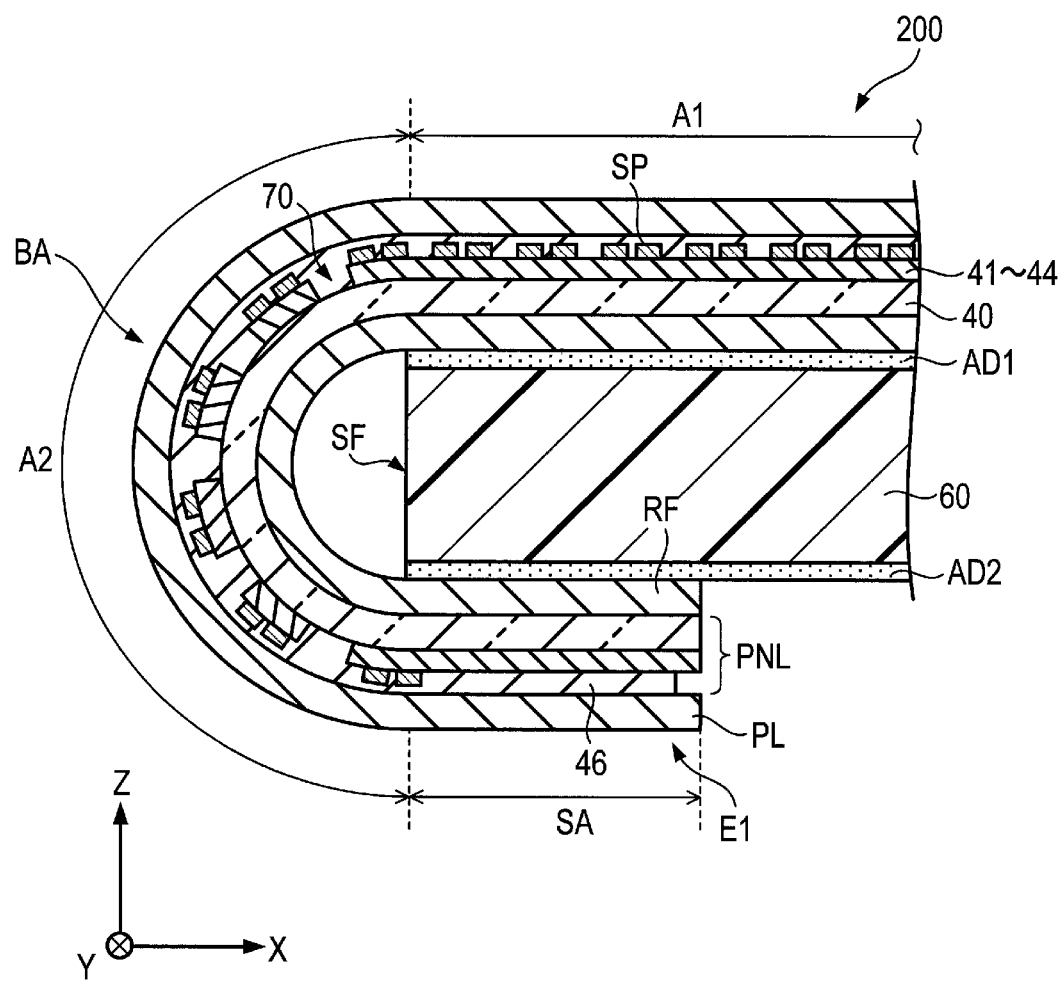
F I G. 19

DISPLAY DEVICE

CROSS-REFERENCE TO RELATED APPLICATIONS

This application is based upon and claims the benefit of priority from Japanese Patent Application No. 2017-192966, filed Oct. 2, 2017, the entire contents of which are incorporated herein by reference.

FIELD

Embodiments described herein relate generally to a display device.

BACKGROUND

Conventionally, glass substrates are used for bases of display panels in display devices, such as liquid crystal display devices or organic electroluminescent display devices. In recent years, display devices comprising display panels that are made flexible by using resin substrates for the bases have been developed. In these display panels, for example, when edge portions of display areas in which pixels are arranged are bent, images can be displayed also in the bent areas.

If the display areas are bent with small radius of curvature, various lines may be damaged. For example, insulating layers made of inorganic materials are likely to crack because of bending stress. This cracking can also damage lines contacting the insulating layers.

BRIEF DESCRIPTION OF THE DRAWINGS

FIG. 1 is an exploded perspective view schematically showing a structure example of a display device in a first embodiment.

FIG. 2 is a schematic plan view of the display device in the first embodiment.

FIG. 4 is a schematic cross-sectional view of a display panel along line IV-IV of FIG. 3.

FIG. 5 is a schematic cross-sectional view of a first substrate, focusing on a switching element.

FIG. 8 is a schematic cross-sectional view of the display panel along line VIII-VIII of FIG. 7.

FIG. 9 is a schematic cross-sectional view of a display panel in a second embodiment.

FIG. 19 is a schematic cross-sectional view showing a state in which the display panel is bent in bent areas shown in FIG. 15.

DETAILED DESCRIPTION

Figure 3:
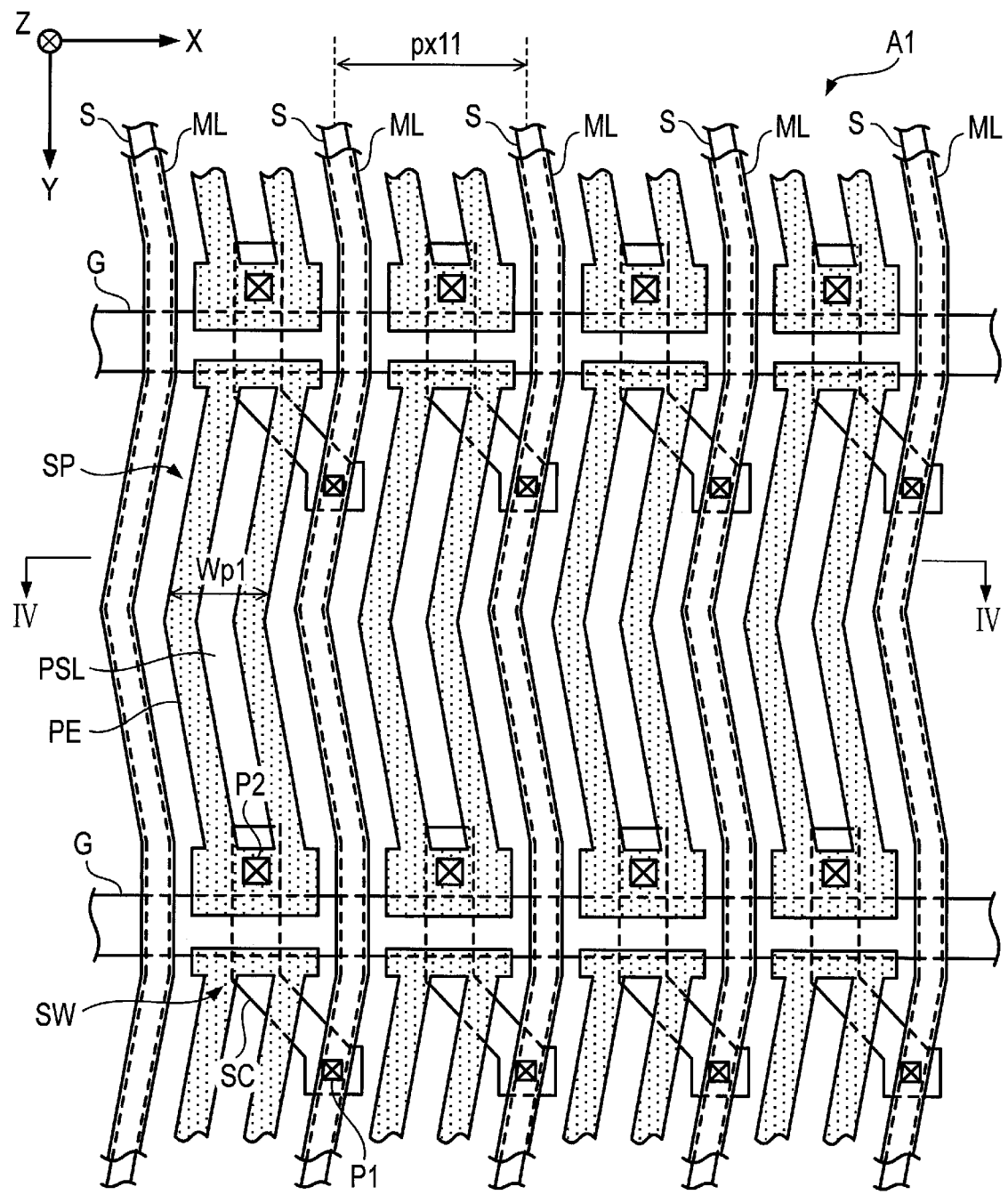
FIG. 3 is a plan view showing a schematic structure of a first area in the first embodiment.

In general, according to one embodiment, a display device comprises: a flexible base; a display area including pixels; first lines arranged in a first direction in the display area; pixel electrodes driven by the first lines; and a first inorganic insulating layer contacting the first lines. The display area includes a first area in which the first lines are arranged in the first direction at a first pitch and a second area in which the first lines are arranged in the first direction at a second pitch greater than the first pitch, and the second area is located between the first area and an edge portion of the base in the first direction. In the second area, the first inorganic insulating layer comprises a first slit extending along the first lines between adjacent first lines of the first lines.

In addition, according to one embodiment, a display device comprises: a flexible base; a display area including pixels; and a light-shielding layer disposed at a boundary between adjacent pixels of the pixels in a first direction. The display area includes a first area and a second area located between the first area and an edge portion of the base in the first direction. A width in the first direction of the light-shielding layer in the second area is greater than a width in the first direction of the light-shielding layer in the first area.

According to the above-described structures, it is possible to prevent a break in lines due to bending in a display device having flexibility.

Embodiments will be described with reference to the accompanying drawings.

The disclosure is merely an example, and proper changes within the spirit of the invention, which are easily conceivable by a person having ordinary skill in the art, are included in the scope of the present invention as a matter of course. In addition, in some cases, in order to make the description clearer, the drawings may be more schematic than in the actual modes, but they are mere examples and do not limit the interpretation of the present invention. In the drawings, reference symbols of the same or similar elements arranged sequentially are often omitted. In the specification and drawings, structural elements that have the same or similar functions as or to those described in connection with preceding drawings are denoted by the same reference symbols, and an overlapping detailed description thereof is omitted unless necessary.

In each of the embodiments, a liquid crystal display device or an organic electroluminescent (EL) display device is disclosed as an example of a display device. However, each of the embodiments does not prevent the application of individual technical ideas disclosed in the embodiments to other types of display device. As the other types of display device, for example, electronic-paper type display devices comprising cataphoretic elements, etc., display devices employing micro-electromechanical systems (MEMS), or display devices employing electrochromism are assumed.

First Embodiment

FIG. 1 is an exploded perspective view schematically showing a structure example of a display device 100. The display device 100 is a liquid crystal display device comprising a backlight BL and a display panel PNL. As shown in the figure, an X direction, a Y direction, and a Z direction are defined. The X, Y, and Z directions are orthogonal to each other in the present embodiment, but may cross at angles other than right angles. In the present disclosure, a direction indicated by an arrow in the Z direction is referred to as "above" or "on", and a direction opposite to the direction indicated by the arrow is referred to as "below" or "under".

In the example of FIG. 1, the backlight BL is a side-edge type backlight comprising a light source unit LU, a light guide LG, and a reflective member RF. However, the structure of the backlight BL is not limited to the example of FIG. 1. Any structure is applicable as long as light necessary for image display is supplied.

In the example of FIG. 1, the display panel PNL and the light guide LG are both formed into a rectangular shape having short sides in the X direction and long sides in the Y direction. The shapes of the display panel PNL and the light guide LG are not limited to a rectangular shape, and may be other shapes.

The light guide LG comprises a first main surface F1 and a second main surface F2 opposite to the first main surface F1. Moreover, the light guide LG comprises a first side surface SF1, a second side surface SF2, a third side surface SF3, and a fourth side surface SF4 which connect the first main surface F1 and the second main surface F2. The first side surface SF1 and the second side surface SF2 are parallel to the Y direction, and the third side surface SF3 and the fourth side surface SF4 are parallel to the X direction.

The light source unit LU comprises light sources LS arranged in the X direction along the third side surface SF3. The light sources LS are, for example, light-emitting diodes, but may be other types of light-emitting device, such as organic electroluminescent devices. The reflective member RM faces the second main surface F2. For example, the reflective member RM comprises a layer formed of a metallic material having excellent reflectivity, such as silver or aluminum.

Light from the light sources LS enters the light guide LG from the third side surface SF3. The light guide LG guides light entering from the third side surface SF3, and emits the light mainly from the first main surface F1. Light is emitted also from each of the side surfaces SF1 to SF4 and the second main surface F2. The light emitted from the second main surface F2 is reflected by the reflective member RM and returned to the light guide LG.

The display panel PNL is a transmissive liquid crystal panel, and comprises a first substrate SUB1, a second substrate SUB2 opposite to the first substrate SUB1, and a liquid crystal layer LC sealed in between the substrates SUB1 and SUB2. The display panel PNL comprises a display area DA including pixels PX, and a surrounding area SA around the display area DA. The pixels PX are arranged in a matrix in the X direction and the Y direction.

The display device 100 further comprises a first polarizer PL1, a second polarizer PL2, and a controller CT. The first polarizer PL1 is disposed between the light guide LG and the first substrate SUB1. The second polarizer PL2 is disposed above the second substrate SUB2. A diffusion sheet or a prism sheet may be disposed between the light guide LG and the first polarizer PL1.

The controller CT controls the display panel PNL and the light source unit LU. For example, the controller CT can be composed of an IC and various circuit elements. The controller CT may be composed of an IC controlling the display panel PNL and an IC controlling the light source unit LU.

FIG. 2 is a schematic plan view of the display device 100. The display panel PNL comprises a first side edge E1, a second side edge E2, a third side edge E3, and a fourth side edge E4. The first side edge E1 and the second side edge E2 are parallel to the Y direction, and the third side edge E3 and the fourth side edge E4 are parallel to the X direction.

The display panel PNL comprises a terminal area TA in which the first substrate SUB1 is exposed from the second substrate SUB2 in the vicinity of the third side edge E3. A terminal T for external connection is provided in the terminal area TA. In the example of FIG. 2, a flexible printed circuit FPC is connected to the terminal T, and the controller CT is mounted on the flexible printed circuit FPC. The way of mounting the controller CT is not limited to this example.

The pixels PX each include sub-pixels SP corresponding to different colors. In the example of FIG. 2, one pixel PX includes a red sub-pixel SPr, a green sub-pixel SPg, and a blue sub-pixel SPb, but is not limited to this example. For example, the pixel PX may include sub-pixels SP of other colors, such as white. In the present disclosure, the sub-pixels are often simply referred to as pixels.

In the present embodiment, the display panel PNL has flexibility, and is bent in bent areas BA along the first side edge E1 and the second side edge E2 (refer to FIG. 6, which will be explained later). FIG. 2 shows a state in which the display panel PNL is not bent in the bent areas BA. The bent areas BA partly overlap the display area DA. That is, the display area DA includes a flat first area A1 and two bent second areas A2. The second areas A2 are located between the first area A1 and the first side edge E1 and between the first area A1 and the second side edge E2, respectively.

FIG. 3 is a plan view showing a schematic structure of the sub-pixels SP in the first area A1. In the display area DA, scanning lines G, signal lines S, metallic lines ML, and pixel electrodes PE are disposed. The scanning lines G extend in the X direction, and are arranged in the Y direction. The signal lines S and the metallic lines ML extend in the Y direction, and are arranged in the X direction at a first pitch px11. The metallic lines ML overlap corresponding ones of the signal lines S.

An area surrounded by adjacent two of the scanning lines G and adjacent two of the signal lines S corresponds to a sub-pixel SP. A pixel electrode PE and a switching element SW are disposed for each of the sub-pixels SP. In the example of FIG. 3, the pixel electrodes PE each comprise one electrode slit PSL, but may include more electrode slits PSL or may not include any electrode slit PSL. The width in the X direction of the pixel electrodes PE in the first area A1 is Wp1.

The switching element SW comprises a semiconductor layer SC. The semiconductor layer SC is connected to a signal line S at a first position P1 and connected to a pixel electrode PE at a second position P2. The semiconductor layer SC crosses a scanning line G once between the first position P1 and the second position P2. That is, the switching element SW is a single-gate type switching element, but may be a double-gate type switching element which crosses the scanning line G twice.

In the example of FIG. 3, the signal lines S are bent between the two adjacent scanning lines G. Moreover, the pixel electrodes PE are bent in the same way as the signal lines S. The signal lines S and the pixel electrodes PE are not limited to this example, and may not be bent.

FIG. 4 is a schematic cross-sectional view of the display panel PNL along line IV-IV of FIG. 3. The first substrate SUB1 comprises a first insulating base 10, a first barrier layer 11, a first insulating layer 12 (interlayer insulating layer), a second insulating layer 13 (planarizing layer), a third insulating layer 14 (capacitance insulating layer), a first alignment film 15, and a common electrode CE. The first substrate SUB1 also comprises the above-described scanning lines G, signal lines S, pixel electrodes PE, and switching elements SW.

The first barrier layer 11 covers the upper surface of the first insulating base 10. The first insulating layer 12 covers the first barrier layer 11. The signal lines S are disposed on the first insulating layer 12. The second insulating layer 13 covers the signal lines S and the first insulating layer 12. The common electrode CE is disposed on the second insulating layer 13. The metallic lines ML are disposed on the common electrode CE. The third insulating layer 14 covers the metallic lines ML and the common electrode CE. The pixel electrodes PE are disposed on the third insulating layer 14. The first alignment film 15 covers the pixel electrodes PE and the third insulating layer 14.

The second substrate SUB2 comprises a second insulating base 20, a second barrier layer 21, a light-shielding layer 22, color filters 23, an overcoat layer 24, and a second alignment film 25. The second barrier layer 21 covers the lower surface of the second insulating base 20. The light-shielding layer 22 and the color filters 23 are disposed under the second barrier layer 21. The color filters 23 in colors corresponding to the sub-pixels SP are disposed for the sub-pixels SP, respectively. The overcoat layer 24 covers the color filters 23. The second alignment film 25 covers the overcoat layer 24.

The light-shielding layer 22 is disposed at boundaries between adjacent ones of the sub-pixels SP, and overlaps the signal lines S, the metallic lines ML, the scanning lines G, the semiconductor layer SC, etc., in planar view. From another point of view, the light-shielding layer 22 has an opening in each of the sub-pixels SP. In the first area A1, the width in the X direction of the light-shielding layer 22 is W11, and the opening width in the X direction of the light-shielding layer 22 in the sub-pixels SP is W12. The width W12 is greater than the width W11 (W11<W12).

The liquid crystal layer LC is disposed between the first alignment film 15 and the second alignment film 25. A spacer PS is disposed between the first alignment film 15 and the second alignment film 25. The spacer PS, for example, overlaps a metallic line ML, a signal line S, and the light-shielding layer 22 in planar view.

FIG. 5 is a schematic cross-sectional view of the first substrate SUB1, focusing on the switching element SW. The first insulating layer 12 shown in FIG. 4 includes insulating layers 12a and 12b. The semiconductor layer SC is disposed on the first barrier layer 11. The insulating layer 12a covers the semiconductor layer SC and the first barrier layer 11. The scanning line G is disposed on the insulating layer 12a. The insulating layer 12b covers the scanning line G and the insulating layer 12a.

The signal line S is disposed on the insulating layer 12b. A relay electrode RE is further disposed on the insulating layer 12b. The second insulating layer 13 covers the signal line S, the relay electrode RE, and the insulating layer 12b. In the first position P1, the signal line S contacts the semiconductor layer SC via a contact hole penetrating the insulating layers 12a and 12b. In the second position P2, the relay electrode RE contacts the semiconductor layer SC via a contact hole penetrating the insulating layers 12a and 12b. Moreover, in the second position P2, the pixel electrode PE contacts the relay electrode RE via a contact hole penetrating the second insulating layer 13.

The first insulating base 10 and the second insulating base 20 are formed of, for example, a resin material such as polyimide, polyester, or polycarbonate. Thus, the first insulating base 10 and the second insulating base 20 have flexibility. Moreover, the first substrate SUB1, the second substrate SUB2, and the display panel PNL also have flexibility.

The pixel electrodes PE and the common electrode CE can be formed of, for example, a transparent conductive material such as indium tin oxide (ITO). The scanning lines G, the signal lines S, and the metallic lines ML can be formed of various metallic materials. The second insulating layer 13 can be formed of, for example, an organic resin material. That is, the second insulating layer 13 corresponds to an organic insulating layer in the present embodiment. The second insulating layer 13 is thicker than the first barrier layer 11, the first insulating layer 12, and the third insulating layer 14, and flattens a difference in level made by the switching elements SW, etc.

The first insulating layer 12 (insulating layers 12a and 12b), the third insulating layer 14, the first barrier layer 11, and the second barrier layer 21 can be formed of, for example, an inorganic material such as silicon oxide (SiOx) or silicon nitride (SiNx). The first insulating layer 12 (insulating layers 12a and 12b), the third insulating layer 14, and the first barrier layer 11 correspond to inorganic insulating layers in the present embodiment. The first barrier layer 11 and the second barrier layer 21 have the function of preventing foreign matter, such as water, from entering the inside of the display panel PNL via the first insulating base 10 and the second insulating base 20, respectively.

The structure of the display panel PNL shown in FIG. 4 corresponds to fringe field switching (FFS) mode, which is a kind of in-plane switching (IPS) mode. The structure of the display panel PNL is not limited to this. For example, the common electrode CE may be located closer to the liquid crystal layer LC than the pixel electrodes PE. In addition, the display panel PNL may have a structure corresponding to other kinds of mode, such as vertical aligned (VA) mode or twisted nematic (TN) mode.

Figure 6:
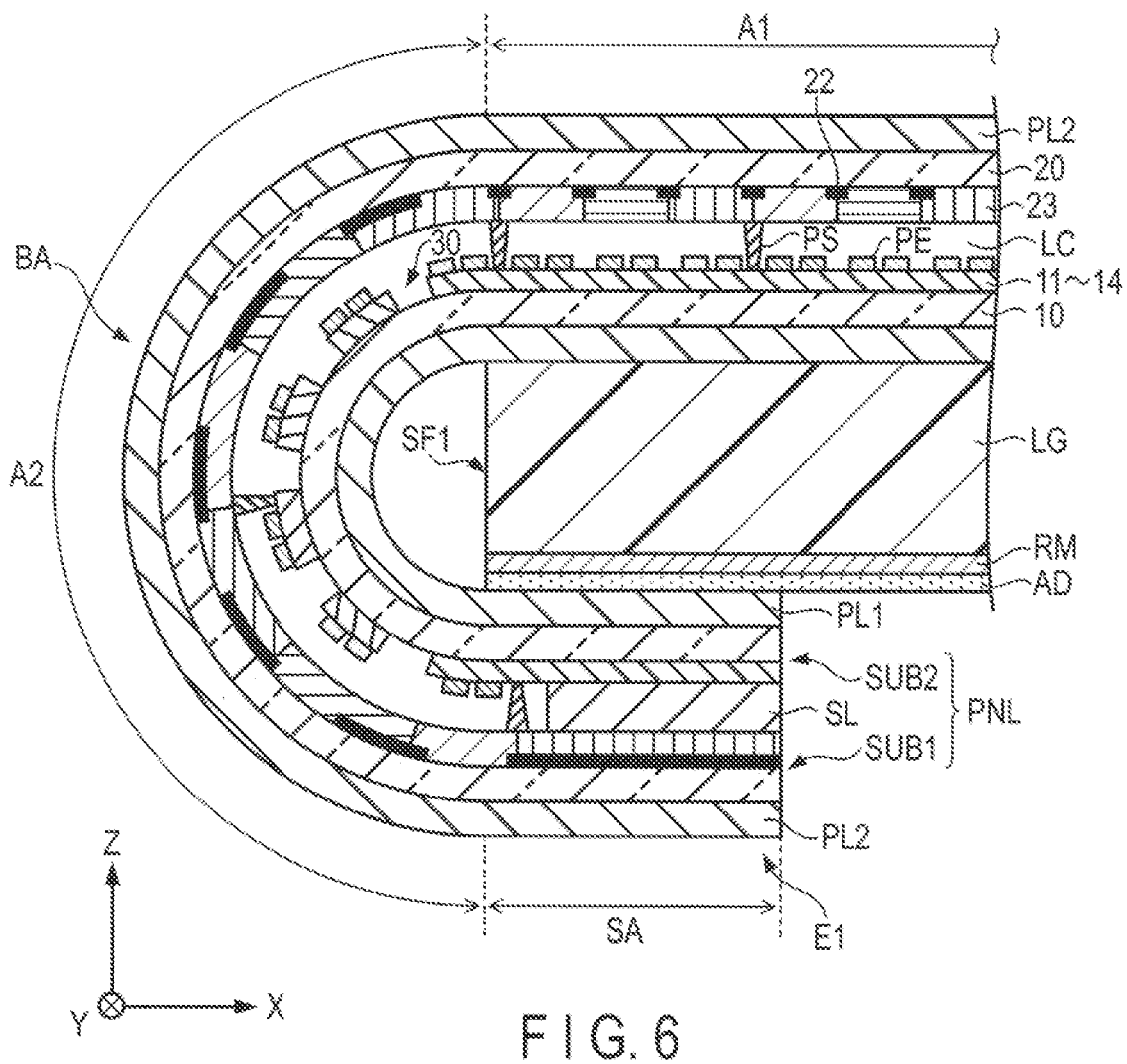
FIG. 6 is a schematic cross-sectional view showing a state in which the display panel is bent in bent areas shown in FIG. 2.

FIG. 6 is a schematic cross-sectional view showing a state in which the display panel PNL is bent in the bent areas BA shown in FIG. 2. Here, the situation in the vicinity of the first side surface SF1 of the light guide LG is shown, and some elements of the first substrate SUB1 and the second substrate SUB2 are omitted. The structure in the vicinity of the second side surface SF2 of the light guide LG is the same as that in FIG. 6.

The display panel PNL is bent at an angle of 180° along the first side surface SF1, such that the surrounding area SA along the first side edge E1 is opposite to the reflective member RM. The first polarizer PL1 and the second polarizer PL2 are also bent with the display panel PNL. An adhesive layer AD is disposed between the reflective member RM and the first polarizer PL1. The first polarizer PL1 is adhered to the reflective member RM by the adhesive layer AD. In the surrounding area SA, a sealing member SL adhering the first substrate SUB1 and the second substrate SUB2 to each other is disposed between these substrates.

Also, the display panel PNL, the first polarizer PL1, and the second polarizer PL2 may be bent at angles other than 180°.

When the display panel PNL is bent in this manner, stress acts on each layer of the first substrate SUB1 and the second substrate SUB2. This stress may cause a crack in each layer. In the first substrate SUB1, cracks are likely to open especially in the first barrier layer 11, the first insulating layer 12, and the third insulating layer 14, which are formed of an inorganic material. If cracks open in these layers, lines, for example, the scanning lines G, can be damaged.

In the present embodiment, as a measure against the above cracks, slits 30 are provided at least in the first insulating layer 12 in the second area A2. On the basis of the above-described structure, the details of the second area A2 will be explained hereinafter.

Figure 7:
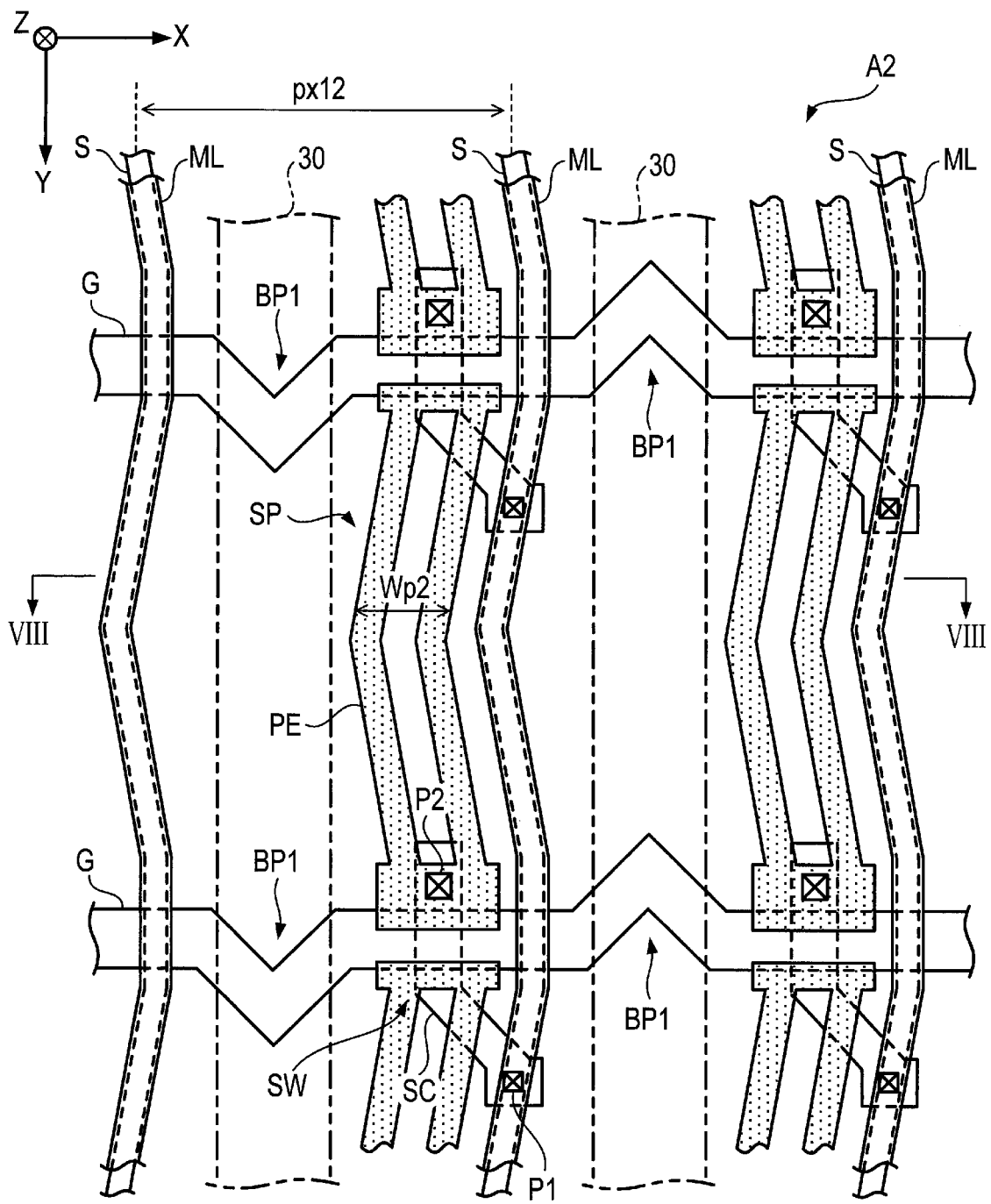
FIG. 7 is a plan view showing a schematic structure of a second area in the first embodiment.

FIG. 7 is a plan view showing a schematic structure of the sub-pixels SP in the second area A2. Also, the plan view shows the structure in a state in which the second area A2 is not bent. In the second area A2, the signal lines S are arranged in the X direction at a second pitch px12. The second pitch px12 is greater than the first pitch px11 of the signal lines S in the first area A1 (px11<px12). As an example, the second pitch px12 is twice greater than the first pitch px11.

For example, the shape of the pixel electrodes PE in the second area A2 is the same as that of the pixel electrodes PE in the first area A1. That is, the width Wp2 in the X direction of the pixel electrodes PE in the second area A2 is equal to the width Wp1 in the X direction of the pixel electrodes PE in the first area A1. As another example, the width Wp1 and the width Wp2 may be different.

A space corresponding to an increase in the pitch of the signal lines S is produced between adjacent ones of the signal lines S. In the example of FIG. 7, the above-described slits 30 are provided in this space. The slits 30 extend in the Y direction along the signal lines S between the signal lines S and the pixel electrodes PE. That is, the slits 30 extend parallel to the bend axis of the bent area BA.

The slits 30 overlap the scanning lines G. The scanning lines G include bent portions BP1 overlapping the slits 30. The bent portions BP1 can be formed into, for example, a V-shape as shown in the figure. In the example of FIG. 7, the shape of the bent portions BP1 between the left signal line S and the central signal line S and that of the bent portions BP1 between the right signal line S and the central signal line S are in line symmetry with respect to the X direction. The bend portions BP1 may have any shape extending in a direction crossing the X direction and the Y direction, and are not limited to the shapes shown in the figure.

FIG. 8 is a schematic cross-sectional view of the display panel PNL along line VIII-VIII of FIG. 7. In the example of FIG. 8, the first insulating layer 12 comprises the slits 30, and further, the first barrier layer 11 comprises slits 31, the third insulating layer 14 comprises slits 32, the second insulating layer 13 comprises slits 33, and the common electrode CE comprises slits 34. The slits 30 to 34 overlap each other. The edge portions of the slits 30 to 34 may be aligned with each other as shown in the figure, or may be partly misaligned.

The light-shielding layer 22 overlaps the slits 30 to 34. In the second area A2, the width in the X direction of the light-shielding layer 22 is W21, and the opening width in the X direction of the light-shielding layer 22 in the sub-pixels SP is W22. The width W21 is greater than the width W11 (W11<W21). The width 22 is, for example, equal to the width W12 (W12=W22). The width W21 is, for example, greater than the width W22 (W21>W22). However, the width W21 may be less than or equal to the width W22 (W21≤W22).

In the positions of the slits 30 to 34, the upper surface of the first substrate SUB1 is recessed in the form of grooves. The spacer PS is disposed at a position not overlapping the slits 30 to 34 to avoid such a difference in level.

As in the present embodiment, if the slits 30 are provided in the first insulating layer 12, which is an inorganic insulating layer, stress acting on the first insulating layer 12 when the second area A2 is bent can be reduced. This can prevent a crack in the first insulating layer 12 and a break in lines, such as the scanning lines G contacting the first insulating layer 12. Since the slits 31 and 32 are also provided in the first barrier layer 11 and the third insulating layer 14, which are inorganic insulating layers, respectively, cracks in the first barrier layer 11 and the third insulating layer 14 also can be prevented.

In addition, since the slits 33 are also provided in the second insulating layer 13, which is thicker than the other insulating layers, the second area A2 is easily bent.

The slits 33 cause a relatively large difference in level on the upper surface of the first substrate SUB1. This difference in level may disturb the alignment of liquid crystal molecules of the liquid crystal layer LC. Moreover, since the common electrode CE comprises the slits 34, electric fields at the portions overlapping the slits 34 of the scanning lines G act on the liquid crystal layer LC without being interrupted by the common electrode CE. This also can disturb the alignment of liquid crystal molecules. However, since the slits 30 to 34 overlap the light-shielding layer 22, an influence of disturbance in alignment does not appear in a displayed image.

The scanning lines G have the bent portions BP1 in the positions overlapping the slits 30 to 34. If the display panel PNL is bent as shown in FIG. 6, great stress can be produced in the direction in which the scanning lines G extend (X direction). Providing the bent portions BP1 reduces such stress acting on the scanning lines G, and can prevent a break in the scanning lines G more surely.

As well as those described above, various advantageous effects can be obtained from the present embodiment.

Second Embodiment

A second embodiment will be described. Structures and effects not particularly mentioned herein are the same as those in the first embodiment.

FIG. 9 is a schematic cross-sectional view of a display panel PNL in the second embodiment. This cross-sectional view shows the structure in a second area A2 as in the case of FIG. 8.

In the present embodiment, a first insulating layer 12 comprises slits 30, a first barrier layer 11 comprises slits 31, and a third insulating layer 14 comprises slits 32. On the other hand, a second insulating layer 13 and a common electrode CE comprise no slit.

In the structure of FIG. 9, a difference in level made by the slits 30 and 31 are flattened by the second insulating layer 13. Thus, as compared to that in FIG. 8, the upper surface of a first substrate SUB1 is flat and the alignment of liquid crystal molecules is hardly disturbed. Moreover, electric fields from lines, such as scanning lines G, can be interrupted by the common electrode CE also in the vicinity of the slits 30 to 32.

In this manner, a disturbance in alignment is hardly caused in the present embodiment. Thus, in the example of FIG. 9, the slits 30 to 32 do not overlap a light-shielding layer 22. A width W21 of the light-shielding layer 22 in the second area A2 is, for example, equal to a width W11 of the light-shielding layer 22 in a first area A1 (W11=W21). In addition, an opening width W22 of the light-shielding layer 22 in each sub-pixel SP of the second area A2 is, for example, greater than an opening width W12 of the light-shielding layer 22 in each sub-pixel SP of the first area A1 (W12<W22). Thus, the luminance of the sub-pixels SP in the second area A2 can be improved.

Third Embodiment

A third embodiment will be described. Structures and effects not particularly mentioned herein are the same as those in the first and second embodiments.

Figure 10:
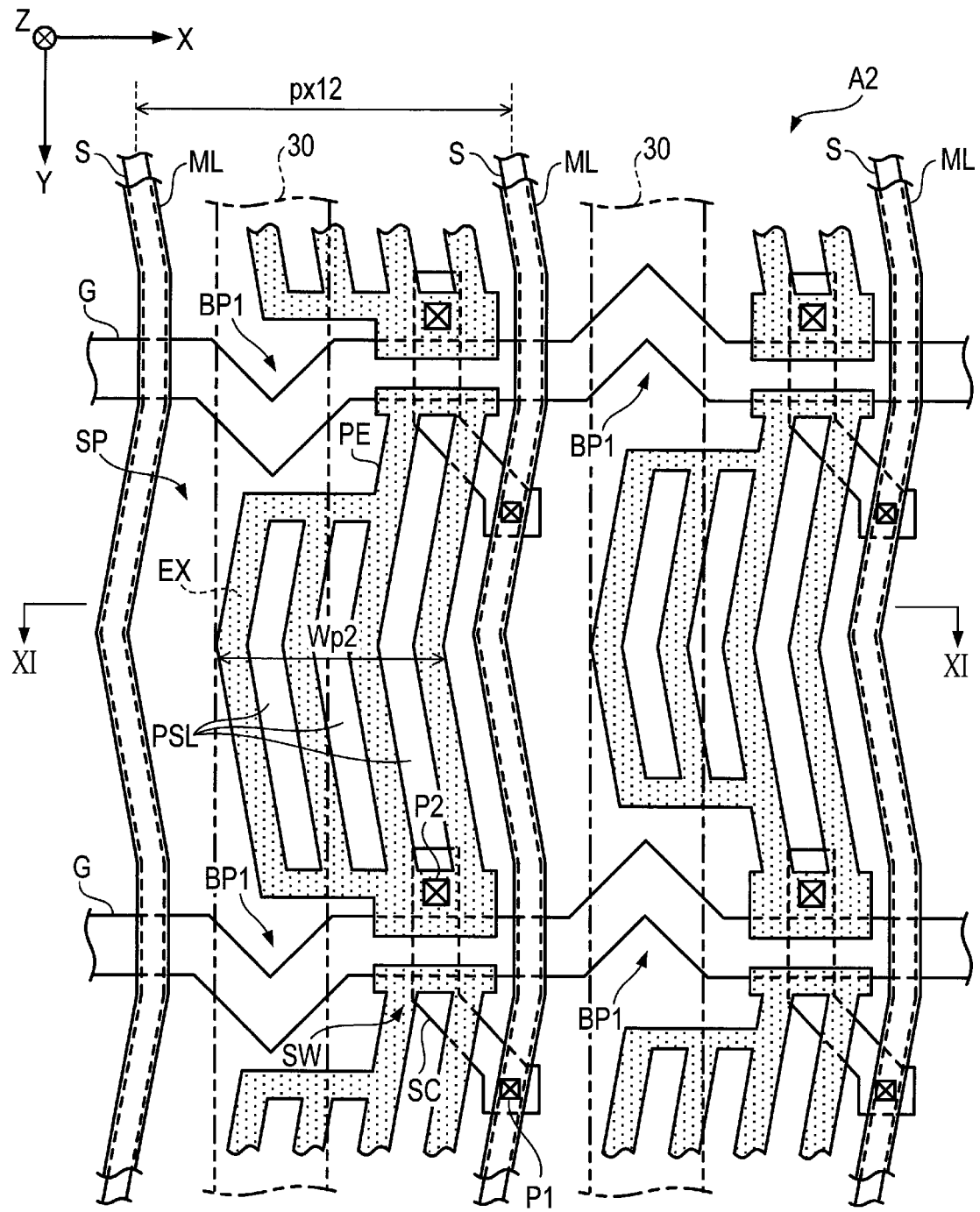
FIG. 10 is a schematic plan view of a second area in a third embodiment.

FIG. 10 is a schematic plan view of a second area A2 in the third embodiment. This plan view shows the structure in a state in which the second area A2 is not bent as in the case of FIG. 7.

In the present embodiment, pixel electrodes PE in the second area A2 include extended portions EX. The extended portions EX overlap slits 30. In the example of FIG. 10, the pixel electrodes PE each comprise three electrode slits PSL in total. However, the shape of the pixel electrodes PE is not limited to this example.

Since the pixel electrodes PE in the second area A2 include the extended portions EX, a width Wp2 in an X direction of the pixel electrodes PE is greater than a width Wp1 in the X direction of the pixel electrodes PE in a first area A1 (Wp1<Wp2).

Figure 11:
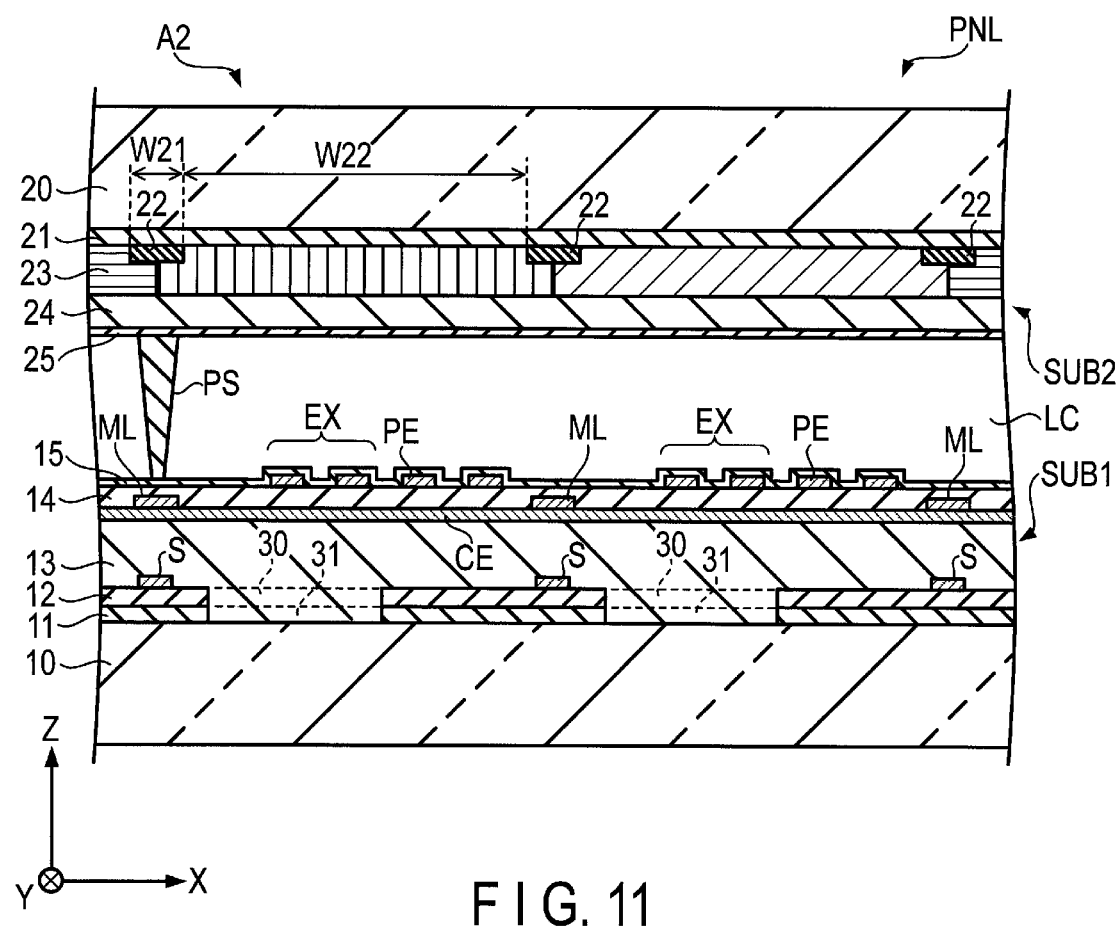
FIG. 11 is a schematic cross-sectional view of a display panel along XI-XI of FIG. 10.

FIG. 11 is a schematic cross-sectional view of a display panel PNL along line XI-XI of FIG. 10. In the present embodiment, a first insulating layer 12 comprises slits 30, and a first barrier layer 11 comprises slits 31. A second insulating layer 13, a common electrode CE, and a third insulating layer 14 comprise no slit. The extended portions EX are opposite to the common electrode CE via the third insulating layer 14. The other structures are the same as those in FIG. 9.

In the structure of the present embodiment, the spaces of the slits 30 and 31 can be used for display. Accordingly, the display quality of sub-pixels SP in the second area A2 can be improved.

Fourth Embodiment

A fourth embodiment will be described. Structures and effects not particularly mentioned herein are the same as those in the first to third embodiments.

Figure 12:
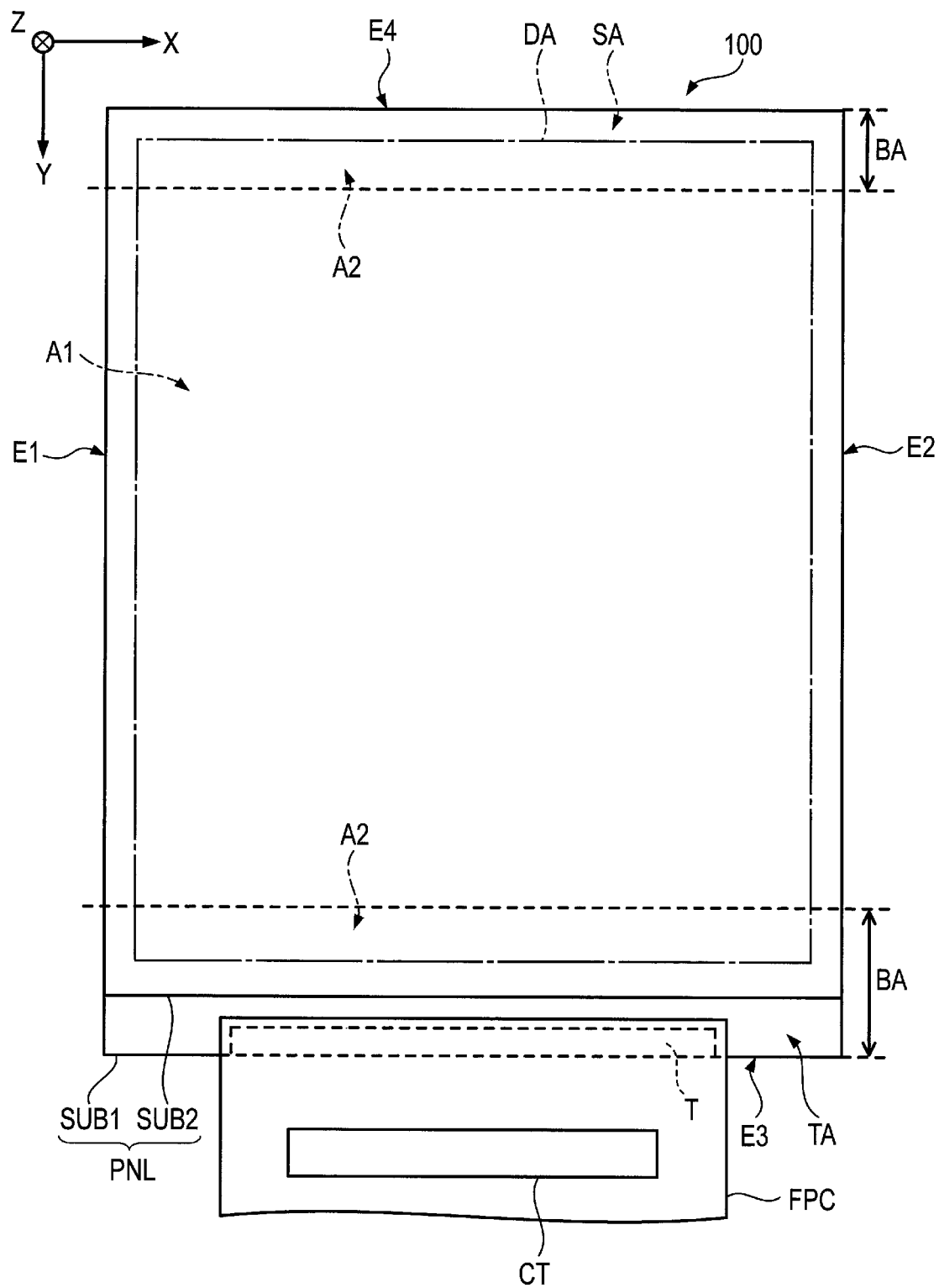
FIG. 12 is a schematic plan view of a display device in a fourth embodiment.

FIG. 12 is a schematic plan view of a display device 100 in the fourth embodiment. In the example shown in the figure, bent areas BA are set along a third side edge E3 and a fourth side edge E4. The bent areas BA are bent along a third side surface SF3 and a fourth side surface SF4 of a light guide LG shown in FIG. 1. Second areas A2 are located between a first area A1 and the third side edge E3 and between the first area A1 and the fourth side edge E4, respectively. A light source unit LU shown in FIG. 1 is, for example, disposed along a first side surface SF1 or a second side surface SF2 of the light guide LG.

Figure 13:
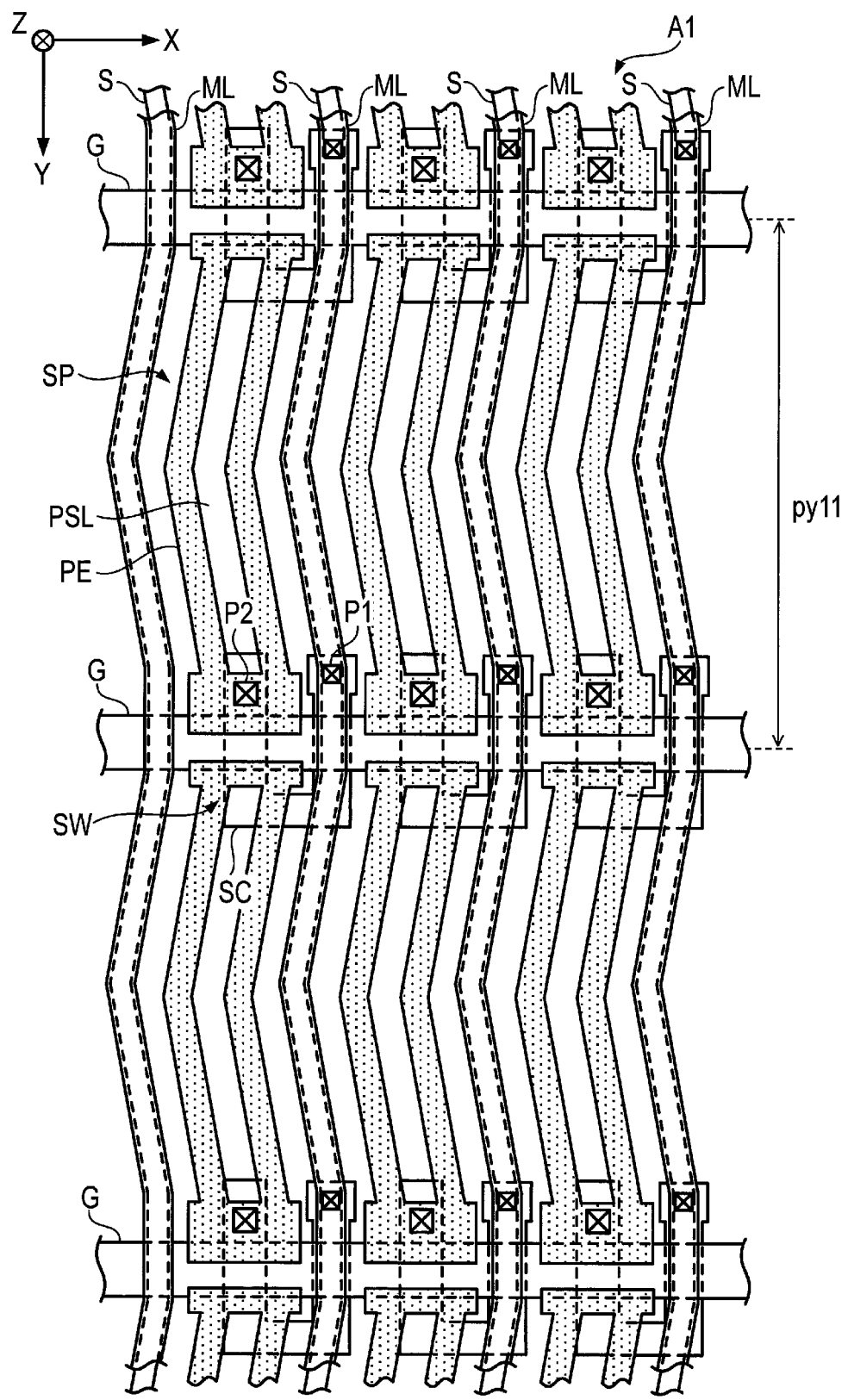
FIG. 13 is a plan view showing a schematic structure of a first area in the fourth embodiment.

FIG. 13 is a plan view showing a schematic structure of sub-pixels SP in the first area A1. In the example shown in the figure, a semiconductor layer SC crosses a scanning line G twice between a first position P1 and a second position P2. That is, a switching element SW is a double-gate type, but may be a single-gate type as in the case of FIG. 3. Scanning lines G are arranged in a Y direction at a first pitch py11.

Figure 14:
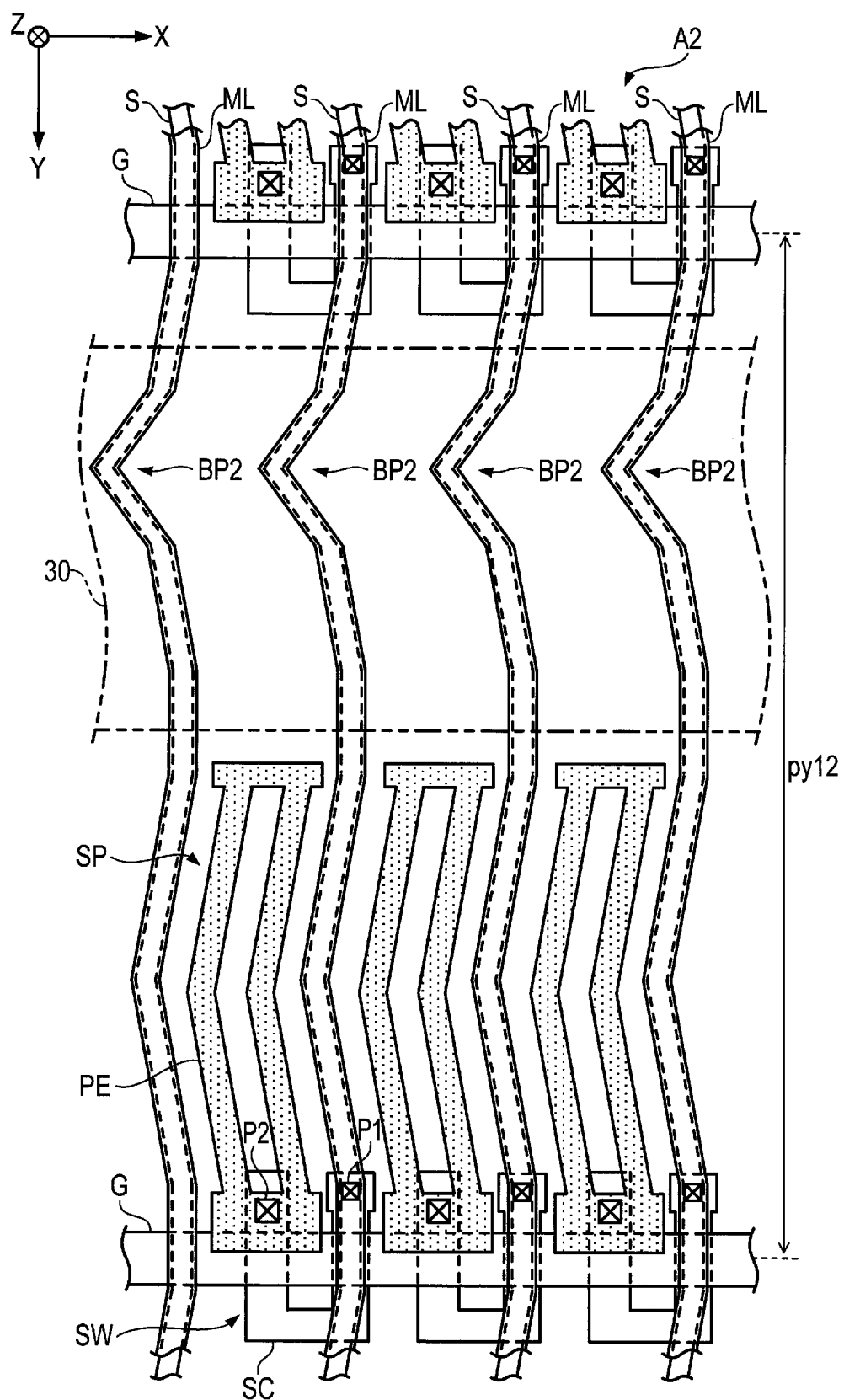
FIG. 14 is a plan view showing a schematic structure of a second area in the fourth embodiment.

FIG. 14 is a plan view showing a schematic structure of the sub-pixels SP in the second area A2. This plan view shows the structure in a state in which the second area A2 is not bent as in the case of FIG. 7. In the second area A2, the scanning lines G are arranged in the Y direction at a second pitch py12. The second pitch py12 is greater than the first pitch py11 of the scanning lines G in the first area A1 (py11<py12). As an example, the second pitch py12 is twice greater than the first pitch py11.

The shape of pixel electrodes PE in the second area A2 is the same as that of the pixel electrodes PE in the first area A1. Thus, a space corresponding to an increase in the pitch of the scanning lines G is produced between adjacent ones of the scanning lines G. In the example of FIG. 14, a slit 30 is provided in this space. The slit 30 extends along the scanning line G in an X direction between the scanning line G and the pixel electrodes PE. That is, the slit 30 extends parallel to a bend axis of a bent area BA shown in FIG. 12.

The slit 30 overlaps signal lines S. The signal lines S comprise bent portions BP2 overlapping the slit 30. The bent portions BP2 have, for example, a V-shape as shown in the figure, and are inclined with respect to the Y direction at an angle greater than the angles at which the other portions of the signal lines S are inclined. Also, the bent portions BP2 are not limited to the shape shown in the figure.

For example, as in the case of the first embodiment, a first barrier layer 11, a third insulating layer 14, a second insulating layer 13, and a common electrode CE may comprise slits 31 to 34 overlapping the slit 30. A light-shielding layer 22 may overlap the slit 30. In this case, as in the case of the relationship between widths W11 and W21 in the first embodiment, a width in the Y direction of the light-shielding layer 22 overlapping the scanning lines G in the second area A2 may be set greater than a width in the Y direction of the light-shielding layer 22 overlapping the scanning lines G in the first area A1.

As another example, it is possible that, as in the case of the second embodiment, the first barrier layer 11 and the third insulating layer 14 comprise the slits 31 and 32 overlapping the slit 30, and the second insulating layer 13 and the common electrode CE comprise no slit. In this case, as in the case of the above-described relationship between opening widths W12 and W22, an opening width in the Y direction of the light-shielding layer 22 in each sub-pixel SP in the second area A2 may be set greater than an opening width in the Y direction of the light-shielding layer 22 in each sub-pixel SP in the first area A1.

Further, as another example, it is possible that, as in the case of the third embodiment, the first barrier layer 11 comprises the slit 31 overlapping the slit 30, and the second insulating layer 13, the third insulating layer 14, and the common electrode CE comprise no slit. In this case, the pixel electrodes PE in the second area A2 may be provided with extended portions overlapping the slit 30.

In the structure of the present embodiment, when the two bent areas BA shown in FIG. 12 are bent on bent axes parallel to the X direction, respectively, stress acting on an inorganic insulating layer, such as a first insulating layer 12, can be reduced. This can prevent a crack in each inorganic insulating layer and a break in lines, such as the signal lines S, due to the crack. Further, since stress acting on the signal lines S can be reduced by the bent portions BP2, a break in the signal lines S can be prevented more surely.

Fifth Embodiment

A fifth embodiment will be described. Structures and effects not particularly mentioned herein are the same as those in the first to fourth embodiments.

In the first to fourth embodiments, liquid crystal display devices have been disclosed as examples of a display device. In the present embodiment, an organic EL display device is disclosed as an example of the display device. The same or similar elements as or to those of the display devices of the first to fourth embodiments will be given the same reference symbols.

Figure 15:
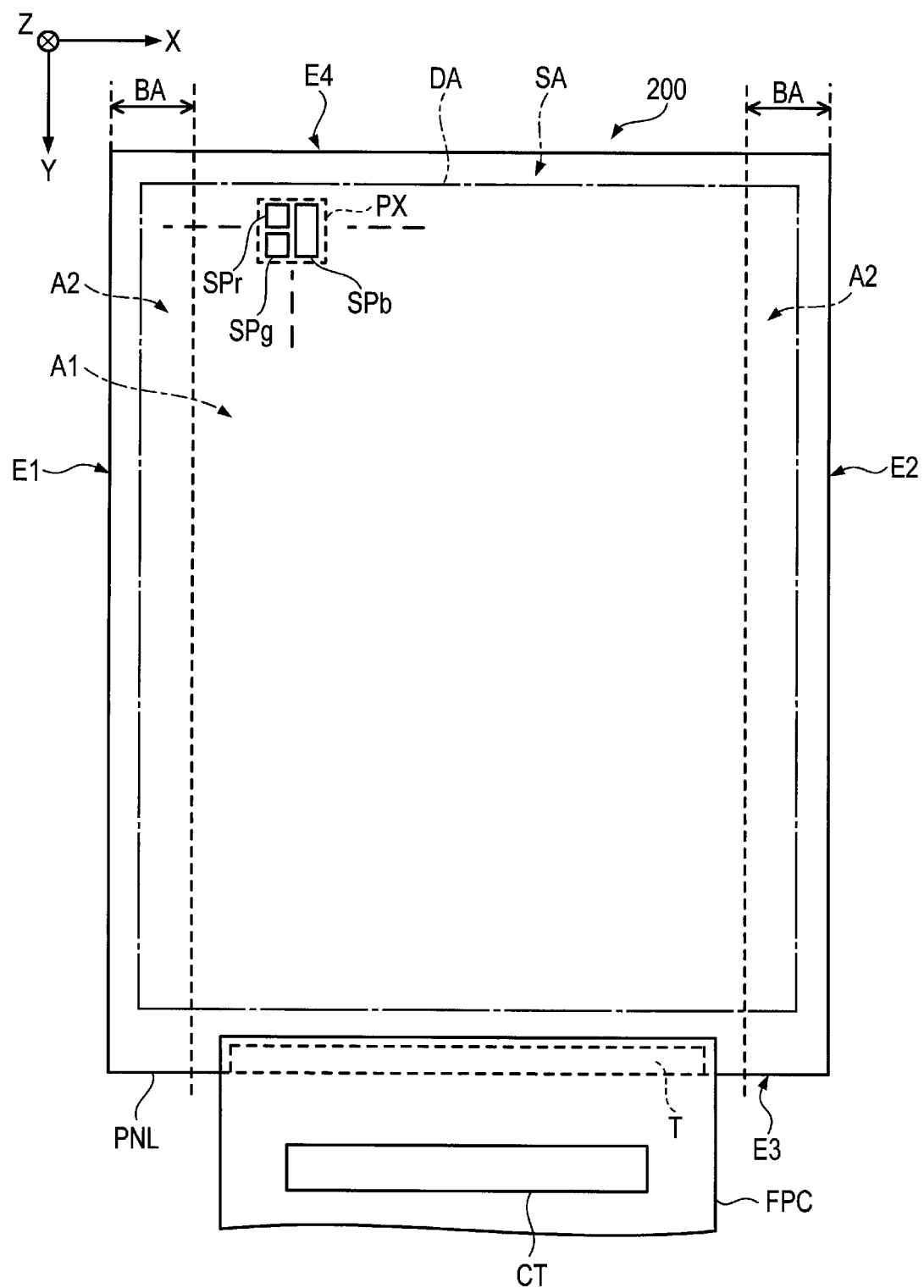
FIG. 15 is a schematic plan view of a display device in a fifth embodiment.

FIG. 15 is a schematic plan view of a display device 200 in the fifth embodiment. The display device 200 comprises a display panel PNL, a controller CT, and a flexible printed circuit FPC. In FIG. 15, the controller CT is mounted on the flexible printed circuit FPC, but is not limited to this example.

The display panel PNL comprises a display area DA including pixels PX, and a surrounding area SA around the display area DA. The pixels PX are arranged in a matrix in an X direction and a Y direction. A terminal T is provided in the surrounding area SA, and the flexible printed circuit FPC is connected to the terminal T.

In the example of FIG. 15, one pixel PX includes a red sub-pixel SPr, a green sub-pixel SPg, and a blue sub-pixel SPb. The sub-pixels SPr and SPg are arranged in the Y direction. The sub-pixel SPb is longer than the sub-pixels SPr and SPg in the Y direction, and arranged in the X direction with the sub-pixels SPr and SPg. The pixel PX is not limited to this example, and the sub-pixels SPr, SPg, and SPb, which are equal in size, may be arranged in the X direction. In addition, the pixel PX may include sub-pixels SP of other colors, such as white.

As in the case of the first embodiment, the display panel PNL is bent in bent areas BA along a first side edge E1 and a second side edge E2. The display area DA includes a flat first area A1 and two second areas A2 overlapping the bent areas BA. The second areas A2 are located between the first area A1 and the first side edge E1 and between the first area A1 and the second side edge E2, respectively.

Figure 16:
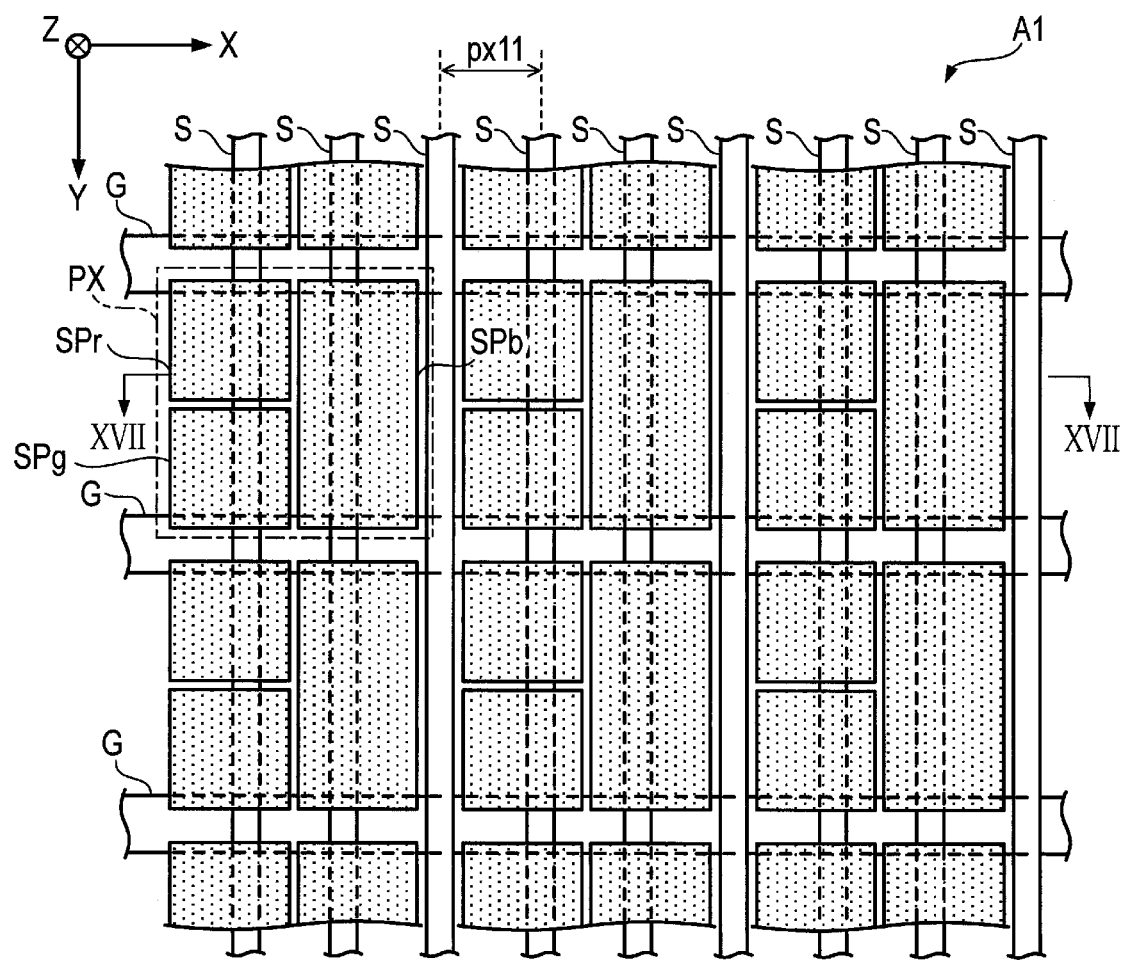
FIG. 16 is a plan view showing a schematic structure of a first area in the fifth embodiment.

FIG. 16 is a plan view showing a schematic structure of the sub-pixels SP in the first area A1. In the display area DA, scanning lines G and signal lines S are disposed. The scanning lines G extend in the X direction, and are arranged in the Y direction. The signal lines S extend in the Y direction, and are arranged in the X direction at a first pitch px11. Each of the sub-pixels SP is driven by corresponding ones of the scanning lines G and signal lines S.

Figure 17:
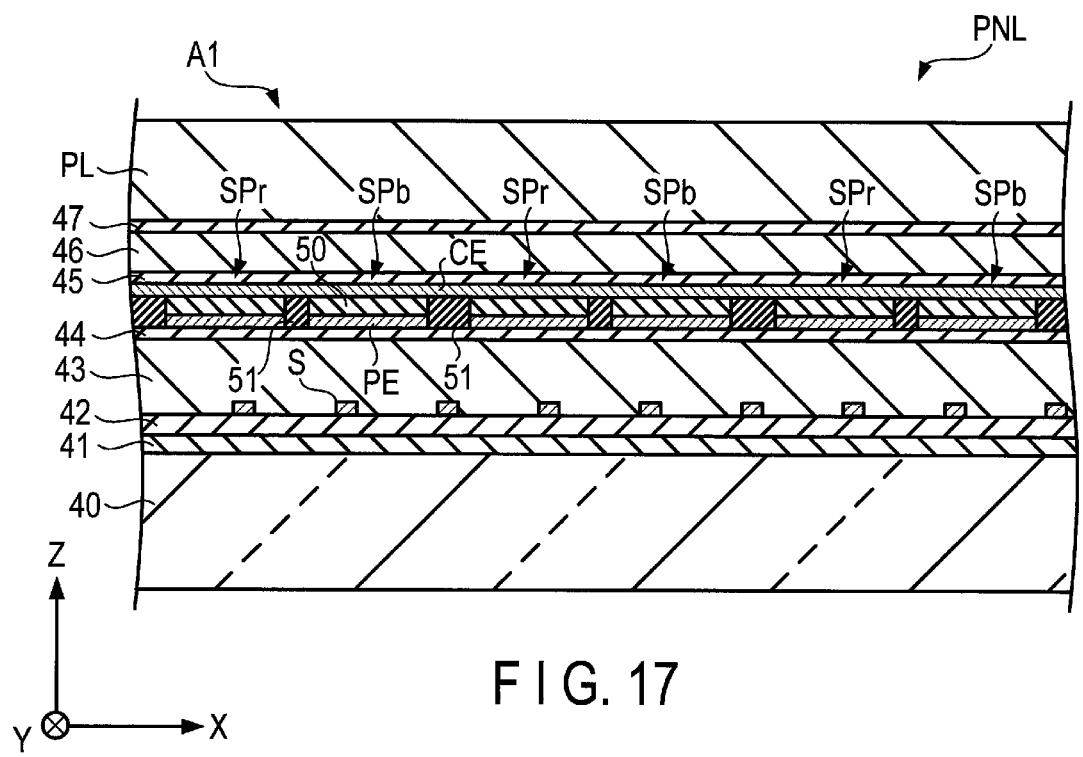
FIG. 17 is a schematic cross-sectional view of a display panel along line XVII-XVII of FIG. 16.

FIG. 17 is a schematic cross-sectional view of the display panel PNL along line XVII-XVII of FIG. 16. The display panel PNL comprises an insulating base 40, a barrier layer 41, a first insulating layer 42 (interlayer insulating layer), a second insulating layer 43 (planarizing layer), a first passivation layer 44, a second passivation layer 45, a sealing layer 46, and a third passivation layer 47. Moreover, the display panel PNL comprises an organic emitting layer 50 and a pixel electrode PE disposed in each of the sub-pixels SP (SPr, SPg, and SPb), a bank 51 disposed at boundaries between the sub-pixels SP, and a common electrode CE.

The insulating base 40 is formed of, for example, a resin material such as polyimide, polyester, or polycarbonate. Thus, the insulating base 40 has flexibility. The barrier layer 41 covers the upper surface of the insulating base 40. The first insulating layer 42 covers the barrier layer 41. The signal lines S are disposed on the first insulating layer 42. The second insulating layer 43 covers the signal lines S and the first insulating layer 42. The first passivation layer 44 covers the second insulating layer 43.

The pixel electrodes PE are disposed on the first passivation layer 44. The organic emitting layers 50 are disposed on the pixel electrodes PE. The banks 51 are disposed between the pixel electrodes PE and the organic light emitting layers 50 of adjacent ones of the sub-pixels SP. The common electrode CE covers the organic emitting layers 50 and the banks 51. The second passivation layer 45 covers the common electrode CE. The sealing layer 46 covers the second passivation layer 45. The third passivation layer 47 covers the sealing layer 46.

The display device 200 further comprises a polarizer PL. The polarizer PL is disposed on the third passivation layer 47.

Figure 18:
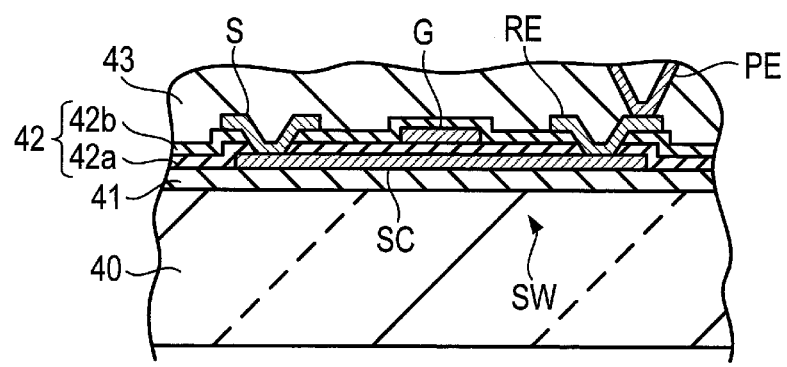
FIG. 18 is a schematic cross-sectional view of the display panel, focusing on a switching element.

At least one switching element SW is disposed for each sub-pixel SP. FIG. 18 is a schematic cross-sectional view of the display panel PNL, focusing on the switching element SW. The first insulating layer 42 shown in FIG. 17 comprises insulating layers 42a and 42b. The switching element SW comprises a semiconductor layer SC disposed on the barrier layer 41. The insulating layer 42a covers the semiconductor layer SC and the barrier layer 41. The scanning line G is disposed on the insulating layer 42a. The insulating layer 42b covers the scanning line G and the insulating layer 42a.

The signal line S is disposed on the insulating layer 42b. A relay electrode RE is further disposed on the insulating layer 42b. The second insulating layer 43 covers the signal line S, the relay electrode RE, and the insulating layer 42b. The signal line S contacts the semiconductor layer SC via a contact hole penetrating the insulating layers 42a and 42b. The relay electrode RE contacts the semiconductor layer SC via a contact hole penetrating the insulating layers 42a and 42b. Moreover, the pixel electrode PE contacts the relay electrode RE via a contact hole penetrating the second insulating layer 43.

A plurality of switching elements SW having the above-described structure may be combined to drive one sub-pixel SP. In this case, the first insulating layer 42 may include three or more insulating layers.

The pixel electrodes PE and the common electrode CE can be formed of, for example, a transparent conductive material such as indium tin oxide (ITO). In this case, a reflective layer formed of a metallic material having excellent reflectivity, such as aluminum or silver, may be disposed below the pixel electrodes PE. In addition, the pixel electrodes PE may be formed of a metallic material having excellent reflectivity. The scanning lines G and the signal lines S can be formed of various metallic materials.

When there is a potential difference between the pixel electrodes PE and the common electrode CE, the organic emitting layers 50 emit light. For example, a color emitted by the organic emitting layer 50 of the sub-pixel SPr is red, a color emitted by the organic emitting layer 50 of the sub-pixel SPg is green, and a color emitted by the organic emitting layer 50 of the sub-pixel SPb is blue. It is possible that the colors of light emitted by the organic emitting layers 50 of the respective sub-pixels SPr, SPg, and SPb are the same (for example, white), and color filters corresponding to the colors of the respective sub-pixels SPr, SPg, and SPb are disposed above the organic emitting layers 50.

The second insulating layer 43 and the sealing layer 46 can be formed of, for example, an organic resin material. The second insulating layer 43 and the sealing layer 46 are, for example, both greater in thickness than the barrier layer 41, the first insulating layer 42, and each of the passivation layers 44, 45, and 47.

The first insulating layer 42 (insulating layers 42a and 42b), the barrier layer 41, and each of the passivation layers 44, 45, and 47 can be formed of, for example, an inorganic material such as SiOx or SiNx, and correspond to inorganic insulating layers in the present embodiment. The barrier layer 41 has the function of preventing foreign matter, such as water, from entering the inside of the display panel PNL via the insulating base 40. Similarly, each of the passivation layers 44, 45, and 47 has the function of preventing foreign matter, such as water, from entering.

FIG. 19 is a schematic cross-sectional view showing a state in which the display panel PNL is bent in the bent areas BA shown in FIG. 15. Here, the situation in the vicinity of the first side edge E1 is shown, and some elements of the display panel PNL are omitted. The structure in the vicinity of the second side edge E2 is the same as that in FIG. 19.

The display device 200 further comprises a spacer 60 opposite to the insulating base 40, and a rear film RF disposed between the insulating base 40 and the spacer 60. The rear film RF is formed of, for example, polyethylene terephthalate (PET), and attached to the lower surface of the insulating base 40. The spacer 60 has, for example, a rectangular shape as in the case of the light guide LG in the first embodiment. The spacer 60 may be disposed only in the vicinity of the bent area BA.

The display panel PNL is bent at an angle of 180° along a side surface SF of the spacer 60. The polarizer PL and the rear film RF are also bent with the display panel PNL. In the first area A1, a first adhesive layer AD1 is disposed between the rear film RF and the upper surface of the spacer 60. The rear film RF is attached to the upper surface of the spacer 60 by the first adhesive layer AD1. In the surrounding area SA, a second adhesive layer AD2 is disposed between the rear film RF and the lower surface of the spacer 60. The rear film RF is attached to the lower surface of the spacer 60 by the second adhesive layer AD2.

When the display panel PNL is bent in this manner, stress acts on each layer of the display panel PNL. Also in the present embodiment, a crack according to bending can open in the first insulating layer 42, which is an inorganic insulating layer, etc. As a measure against this crack, slits 70 are provided at least in the first insulating layer 42 in the second area A2. On the basis of the above-described structure, the details of the second area A2 will be explained hereinafter.

Figure 20:
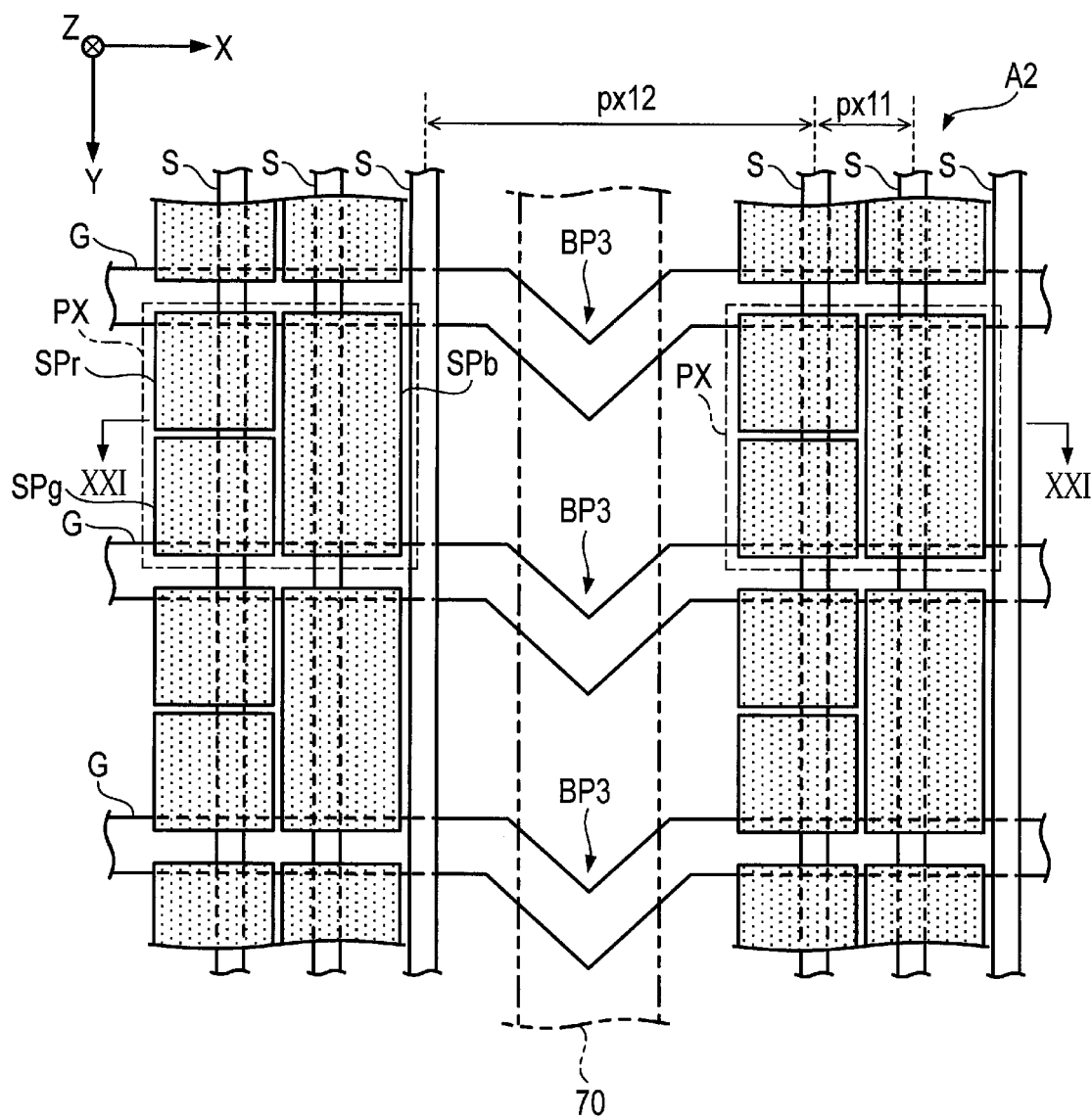
FIG. 20 is a plan view showing a schematic structure of a second area in the fifth embodiment.

FIG. 20 is a plan view showing a schematic structure of the sub-pixels SP (SPr, SPg, and SPb) in the second area A2. Also, the plan view shows the structure in a state in which the second area A2 is not bent. In the second area A2, two signal lines S adjacent at a boundary between the pixels PX are arranged in the X direction at a second pitch px12. The second pitch px12 is greater than the first pitch px11 of the signal lines S in the first area A1 (px11<px12). As an example, the second pitch px12 is twice greater than the first pitch px11.

In the example of FIG. 20, three signal lines S (three lines on the left side or three lines on the right side in the figure) corresponding to one pixel PX are arranged at the first pitch px11. These signal lines S also may be arranged at the second pitch px12.

The slit 70 extends in the Y direction along the signal lines S between the pixels PX adjacent in the X direction. That is, the slit 70 extends parallel to the bend axis of the bent area BA.

The slit 70 overlaps the scanning lines G. The scanning lines G comprise bent portions BP3 overlapping the slit 70.

The bent portions BP3 can be formed into, for example, a V-shape as shown in the figure, but are not limited to this shape.

Figure 21:
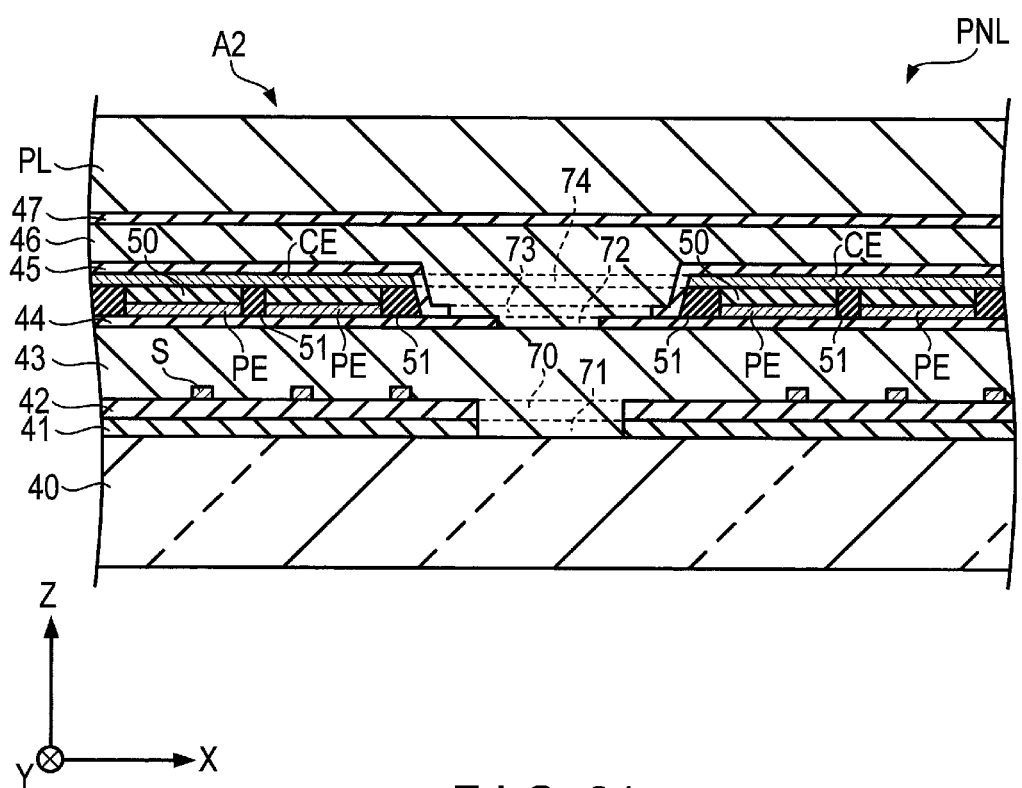
FIG. 21 is a schematic cross-sectional view of the display panel along line XXI-XXI of FIG. 20.

FIG. 21 is a schematic cross-sectional view of the display panel PNL along line XXI-XXI of FIG. 20. In the example of FIG. 21, the first insulating layer 42 comprises the slit 70, and further, the barrier layer 41 comprises a slit 71, the first passivation layer 44 comprises a slit 72, the second passivation layer 45 comprises a slit 73, and the common electrode CE comprises a slit 74. The slits 70 to 74 overlap each other. In the vicinity of the slit 73, edge portions of the second passivation layer 45 contact the first passivation layer 44.

As in the present embodiment, if the slit 70 is provided in the first insulating layer 42, which is an inorganic insulating layer, stress acting on the first insulating layer 42 when the second area A2 is bent can be reduced. This can prevent a crack in the first insulating layer 42 and a break in lines, such as the scanning lines G contacting the first insulating layer 42. Since the slits 71, 72, and 73 are also provided in the barrier layer 41, the first passivation layer 44, and the second passivation layer 45, respectively, cracks in these inorganic insulating layers also can be prevented. In addition, since the slits 70 to 74 are provided, the second area A2 is easily bent.

The scanning lines G comprise the bent portions BP3 in positions overlapping the slits 70 to 74. If the display panel PNL is bent as shown in FIG. 19, great stress can be produced in the direction in which the scanning lines G extend. Providing the bent portions BP3 reduces such stress acting on the scanning lines G, and can prevent a break in the scanning lines G more surely.

Also, the slits 71 to 74 may not be provided. Also in this case, the effect of preventing a crack in the first insulating layer 42 and a break in the scanning lines G can be achieved by the slit 70. In addition, a slit may be provided in at least one of the second insulating layer 43 and the sealing layer 46 in a position overlapping the slit 70. In this case, the second area A2 is more easily bent.

As in the case of the example shown in FIG. 12 in the fourth embodiment, it is possible the bent areas BA are set along a third side edge E3 and a fourth side edge E4, and the bent areas BA are bent on bend axes parallel to the X direction. In this case, as shown in FIG. 13 and FIG. 14, it is possible that the scanning lines G are arranged in the Y direction at a first pitch py11 in the first area A1, and the scanning lines G are arranged in the Y direction at a second pitch py12 greater than the first pitch py12 in the second area A2. As in the case of the slit 30 shown in FIG. 13, the slit 70 can be provided in the X direction between the adjacent scanning lines G. In positions overlapping the slit 70, the signal lines S may be provided with bent portions.

In any of the above-described first to fifth embodiments, a display area DA includes a first area A1 in which first lines are arranged in a first direction at a first pitch, and a second area A2 in which the first lines are arranged in the first direction at a second pitch greater than the first pitch, and the second area A2 is located between the first area A1 and an edge portion of a base in the first direction. In the second area A2, an inorganic insulating layer comprises a first slit extending along the first lines between adjacent ones of the first lines. Moreover, second lines arranged in a second direction crossing the first direction are bent in positions overlapping the first slit.

As shown in FIG. 2 and FIG. 15, if the bent areas BA extend in the Y direction, the signal lines S correspond to the above first lines, the scanning lines G correspond to the above second lines, the X direction corresponds to the above first direction, and the Y direction corresponds to the above second direction. As shown in FIG. 12, if the bent areas BA extend in the X direction, the scanning lines G correspond to the above first lines, the signal lines S correspond to the above second lines, the Y direction corresponds to the above first direction, and the X direction corresponds to the above second direction.

All of the display devices that can be implemented by a person having ordinary skill in the art through arbitrary design changes to the display devices described above as embodiments of the present invention come within the scope of the present invention as long as they are in keeping with the spirit of the present invention.

Various modifications are easily conceivable within the category of the ideas of the present invention by a person having ordinary skill in the art, and the modifications are also considered to fall within the scope of the present invention. For example, additions, deletions or changes in design of the structural elements, or additions, omissions or changes in condition of the processes arbitrarily conducted by a person having ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person having ordinary skill in the art, are considered to be achievable by the present invention as a matter of course.

What is claimed is:

1. A display device comprising:
a flexible base;
a display area including pixels;
first lines arranged in a first direction in the display area;
pixel electrodes driven by the first lines;
a first inorganic insulating layer contacting the first lines; and
a light-shielding layer overlapping each of the first lines and comprising an opening in each of the pixels,
wherein the display area includes a first area in which the first lines are arranged in the first direction at a first pitch and a second area in which the first lines are arranged in the first direction at a second pitch greater than the first pitch, the second area being located between the first area and an edge portion of the base in the first direction,
in the second area, the first inorganic insulating layer comprises a first slit extending along the first lines between adjacent first lines of the first lines,
the first slit overlaps the light-shielding layer, and
a width in the first direction of the opening in the second area is greater than a width in the first direction of the opening in the first area.

2. The display device of claim 1, wherein the base is flat in the first area, and bent in the second area.

3. The display device of claim 2, wherein the first slit extends parallel to a bend axis of the second area.

4. The display device of claim 1, wherein a width in the first direction of the light-shielding layer in the second area is greater than a width in the first direction of the light-shielding layer in the first area.

5. The display device of claim 1, further comprising second lines arranged in a second direction crossing the first direction in the display area,
wherein the second lines are bent in positions overlapping the first slit.

6. The display device of claim 1, further comprising an organic insulating layer disposed between the first lines and the pixel electrodes,
wherein the organic insulating layer comprises a second slit overlapping the first slit.

7. The display device of claim 1, further comprising a second inorganic insulating layer disposed between the base and the first inorganic insulating layer,
wherein the second inorganic insulating layer comprises a third slit overlapping the first slit.

8. The display device of claim 1, further comprising:
a common electrode disposed between the pixel electrodes and the first inorganic insulating layer; and
a second inorganic insulating layer disposed between the common electrode and the pixel electrodes,
wherein the second inorganic insulating layer comprises a fourth slit overlapping the first slit.

9. The display device of claim 1, further comprising a common electrode disposed between the pixel electrodes and the first inorganic insulating layer,
wherein the common electrode comprises a fourth slit overlapping the first slit.

10. The display device of claim 1, wherein a width in the first direction of the pixel electrodes disposed in the second area is greater than a width in the first direction of the pixel electrodes disposed in the first area, and
the pixel electrodes disposed in the second area overlap the first slit.

11. The display device of claim 1, further comprising:
a flexible first substrate including the base, the first lines, the pixel electrodes, and the first inorganic insulating layer;
a flexible second substrate opposite to the first substrate;
a liquid crystal layer disposed between the first substrate and the second substrate; and
a backlight including a light guide opposite to the first substrate and a light source which radiates light to the light guide,
wherein in the second area, the first substrate and the second substrate are bent along a side surface of the light guide.

12. The display device of claim 1, further comprising:
emitting layers disposed in the pixels, respectively, and emitting light by voltages applied through the pixel electrodes; and
a spacer opposite to the base,
wherein in the second area, the base is bent along a side surface of the spacer.

13. The display device of claim 1, wherein the first slit is located between one of adjacent first lines of the first lines and the pixel electrode disposed between the adjacent first lines in the second area.

14. The display device of claim 1, further comprising semiconductor layers provided in the pixels, respectively,
wherein the first lines are signal lines connected to the pixel electrodes via the semiconductor layers.

15. The display device of claim 1, further comprising semiconductor layers provided in the pixels, respectively,
wherein the first lines are scanning lines crossing the semiconductor layers.

* * * * *